United States Patent
Hamatani et al.

(10) Patent No.: US 9,312,513 B2
(45) Date of Patent: Apr. 12, 2016

(54) LIGHTING DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Toshiji Hamatani, Atsugi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/294,599

(22) Filed: Jun. 3, 2014

(65) Prior Publication Data

US 2014/0264310 A1 Sep. 18, 2014

Related U.S. Application Data

(62) Division of application No. 13/399,301, filed on Feb. 17, 2012, now Pat. No. 8,764,504.

(30) Foreign Application Priority Data

Feb. 25, 2011 (JP) .................. 2011-039849
Feb. 25, 2011 (JP) .................. 2011-039850

(51) Int. Cl.
*H01L 51/50* (2006.01)
*H01L 51/52* (2006.01)
*H05B 33/10* (2006.01)
(Continued)

(52) U.S. Cl.
CPC .......... *H01L 51/5253* (2013.01); *G02B 3/0025* (2013.01); *G02B 3/0056* (2013.01); *G02B 5/0226* (2013.01); *H01L 51/50* (2013.01); *H01L 51/5268* (2013.01); *H01L 51/5275* (2013.01); *H05B 33/10* (2013.01); *G02B 5/0268* (2013.01); *H01L 2251/10* (2013.01); *H01L 2251/5369* (2013.01)

(58) Field of Classification Search
CPC .......... H01L 51/5265–51/5278; G02B 5/0226; G02B 5/0268; G02B 5/021–5/0231; G02B 3/00–3/14
See application file for complete search history.

(56) References Cited

U.S. PATENT DOCUMENTS

| 6,717,359 | B2 | 4/2004 | Kimura |
| 6,849,877 | B2 | 2/2005 | Yamazaki et al. |
| 7,002,659 | B1 | 2/2006 | Yamazaki et al. |

(Continued)

FOREIGN PATENT DOCUMENTS

| JP | 11-283743 A | 10/1999 |
| JP | 2000-131505 A | 5/2000 |

(Continued)

*Primary Examiner* — Mariceli Santiago
(74) *Attorney, Agent, or Firm* — Robinson Intellectual Property Law Office; Eric J. Robinson

(57) ABSTRACT

The lighting device includes a first resin layer having a first refractive index and a second resin layer having a second refractive index lower than the first refractive index and higher than the refractive index of the air, which are over a light-emitting element layer, a plurality of granules provided at the interface between the first resin layer and the second resin layer and each having the second refractive index or a plurality of projections each having an apex provided inside the first resin layer and a flat surface in contact with the interface between the first resin layer and the second resin layer and having the second refractive index, an uneven structure provided at the interface with the air, and a resin substrate having the second refractive index.

14 Claims, 12 Drawing Sheets

(51) Int. Cl.
*G02B 5/02* (2006.01)
*G02B 3/00* (2006.01)

(56) References Cited

U.S. PATENT DOCUMENTS

| | | |
|---|---|---|
| 7,211,828 B2 | 5/2007 | Yamazaki et al. |
| 7,230,271 B2 | 6/2007 | Yamazaki et al. |
| 7,271,411 B2 | 9/2007 | Koyama et al. |
| 7,291,969 B2 | 11/2007 | Tsutsui |
| 7,420,208 B2 | 9/2008 | Yamazaki et al. |
| 7,427,223 B2 | 9/2008 | Kimura |
| 7,728,326 B2 | 6/2010 | Yamazaki et al. |
| 7,859,627 B2 | 12/2010 | Nishida et al. |
| 7,952,101 B2 | 5/2011 | Yamazaki et al. |
| 7,973,471 B2 | 7/2011 | Kimura |
| 8,593,059 B2 | 11/2013 | Tanaka et al. |
| 8,853,724 B2 | 10/2014 | Seo et al. |
| 2005/0064780 A1 | 3/2005 | Auch et al. |
| 2005/0258436 A1 | 11/2005 | Arai |
| 2007/0108900 A1 | 5/2007 | Boek et al. |
| 2007/0228382 A1 | 10/2007 | Yamazaki et al. |
| 2007/0228933 A1 | 10/2007 | Maruyama et al. |
| 2008/0129184 A1 | 6/2008 | Nishida et al. |
| 2008/0129933 A1 | 6/2008 | Nishida et al. |
| 2008/0130122 A1 | 6/2008 | Egi et al. |
| 2008/0150420 A1 | 6/2008 | Tsutsui |
| 2009/0079336 A1* | 3/2009 | Yamada et al. ............... 313/504 |
| 2010/0163859 A1 | 7/2010 | Yamazaki et al. |
| 2011/0043735 A1 | 2/2011 | Kozuma et al. |
| 2011/0134647 A1 | 6/2011 | Nishida et al. |
| 2011/0147777 A1* | 6/2011 | Konno et al. ................. 257/98 |
| 2011/0233557 A1 | 9/2011 | Yamazaki et al. |
| 2011/0266946 A1 | 11/2011 | Kimura |
| 2011/0278557 A1* | 11/2011 | Konno et al. ................. 257/40 |

FOREIGN PATENT DOCUMENTS

| | | |
|---|---|---|
| JP | 2007-226178 A | 9/2007 |
| WO | WO-2010/132219 A1 | 11/2010 |

* cited by examiner

LIGHTING DEVICE AND METHOD FOR MANUFACTURING THE SAME

BACKGROUND OF THE INVENTION

1. Field of the Invention

One embodiment of the present invention relates to a lighting device and a method for manufacturing the lighting device.

2. Description of the Related Art

In recent years, development has been conducted on lighting using a light-emitting element which utilizes organic electroluminescence (EL) (hereinafter referred to as an organic EL light-emitting element). Since organic EL light-emitting elements can be formed in a film form, organic EL light-emitting elements can provide planar light emission and can be used as planar light sources. This is a distinctive feature that is difficult to obtain with a point light source typified by an incandescent lamp or an LED or a linear light source typified by a fluorescent lamp, and the utility value of organic EL light-emitting elements is high.

However, in the case of a light-emitting element emitting light in a region with a higher refractive index than the air, such as an organic EL light-emitting element, there is a condition under which part of light emitted from the light-emitting element is totally reflected at an interface between the air and a device including the light-emitting element. As a result, efficiency in extracting light from the inside of the light-emitting element to the air does not reach 100%.

On the other hand, as for an improvement in light use efficiency, a microlens array in which a plurality of minute lenses is arranged has been developed for the sake of collecting light in an opening of a pixel in a liquid crystal panel or collecting light in an opening of a light receiving element in a digital camera. For example, Patent Document 1 discloses a microlens array in which minute lenses are arranged on both sides and with which a display screen of a liquid crystal panel can be brightened.

REFERENCE

[Patent Document 1] Japanese Published Patent Application No. 2000-131505

SUMMARY OF THE INVENTION

However, in order to obtain more highly efficient lighting, a lighting device having a microlens array by which light from a light-emitting element can be utilized more efficiently is required.

In view of the above, an object of one embodiment of the disclosed invention is to provide a lighting device from which light can be extracted from a light-emitting element efficiently Further, an object of one embodiment of the disclosed invention is to suppress the manufacturing cost of the lighting device.

One embodiment of the disclosed invention relates to a lighting device including a light-emitting element layer provided over a substrate; a barrier layer provided over the light-emitting element layer and having a first refractive index; a first resin layer provided over the barrier layer and having the first refractive index; a second resin layer provided over the first resin layer and having a second refractive index which is lower than the first refractive index and higher than a refractive index of air; a plurality of granules provided at an interface between the first resin layer and the second resin layer and having the second refractive index; and a resin substrate that is provided over the second resin layer, includes an uneven structure at an interface with the air, and has the second refractive index. A difference in height of unevenness of the uneven structure is greater than a distance from an apex of the granule to the interface between the first resin layer and the second resin layer.

Light generated in the light-emitting element layer is extracted to the outside (the air) through the barrier layer, the first resin layer, the plurality of granules, the second resin layer, and the resin substrate.

The barrier layer and the first resin layer are formed to have substantially equal refractive indices. In this specification, the refractive index of the barrier layer and the first resin layer is referred to as a first refractive index. The barrier layer and the first resin layer are formed as described above, whereby a relatively large proportion of light passes through the barrier layer and the first resin layer.

The first refractive index is greater than or equal to 1.65 and less than or equal to 2.3, for example. The barrier layer and the first resin layer are formed to have substantially equal refractive indices in this range.

There is a difference between the refractive index of the first resin layer and the refractive index of the second resin layer. However, the plurality of granules each having the same refractive index as that of the second resin layer are provided at the interface between the first resin layer and the second resin layer. Therefore, total reflection of light can be suppressed, so that a larger amount of light can be extracted to the second resin layer. Note that in this specification, the refractive index of the second resin layer, each of the plurality of granules, and the resin substrate is referred to as a second refractive index. The second refractive index is lower than the first refractive index and higher than the refractive index of the air.

The second refractive index is greater than or equal to 1.5 and less than or equal to 1.6, for example, and greater than 1.0 that is the refractive index of the air. The second resin layer, each of the plurality of granules, and the resin substrate are combined to have substantially equal refractive indices in the above range.

Each of the plurality of granules, the second resin layer, and the resin substrate are combined to have substantially equal refractive indices. Thus, light extracted to the second resin layer through the plurality of granules reaches the interface between the resin substrate and the air.

Note that a granule whose cross-sectional shape is a circle or an ellipse is used as the granule. As such a granule, a spherical granule and a spherical granule which is flattened are given as examples.

Although there is a difference between the refractive index of the resin substrate and the refractive index of the air, the uneven structure is provided at the interface between the resin substrate and the air, so that total reflection of light can be suppressed and a larger amount of light can be extracted to the air.

One embodiment of the disclosed invention relates to a method for manufacturing a lighting device including the steps of forming a light-emitting element layer and a barrier layer over a substrate; forming an uncured first resin layer over the barrier layer; scattering a plurality of granules that is electrostatically charged over the uncured first resin layer so that part of each of the plurality of granules is embedded in the first resin layer; curing the first resin layer over which the plurality of granules is scattered; forming a second resin layer over the first resin layer which is cured and the plurality of granules; and forming a resin substrate that includes an uneven structure at an interface with the air over the second resin layer. A difference in height of unevenness of the uneven structure is greater than a distance from an apex of the granule to an interface between the first resin layer and the second resin layer. The barrier layer and the first resin layer each have a first refractive index. Each of the plurality of granules, the second resin layer, and the resin substrate each have a second refractive index lower than the first refractive index and higher than a refractive index of the air.

In one embodiment of the disclosed invention, the distance from the apex of the granule to the interface between the first resin layer and the second resin layer is greater than or equal to 0.5 μm and less than or equal to 50 μm, and the difference in the height of the unevenness of the uneven structure is greater than or equal to 100 μm and less than or equal to 5 mm.

As a method for forming a minute uneven structure, a method for forming an uneven structure by etching a surface of a resin substrate, a method for forming an uneven structure by stamping with the use of a mold, or the like has been known.

However, in the case of forming such a minute uneven structure with the use of a mold, very high processing accuracy and experiences are required for manufacturing the mold. For this reason, the manufacture of such a mold costs a great deal of money. Moreover, a mold used for forming a minute uneven structure over a large area substrate of lighting or the like also needs to have a large area, which leads to an increase in the manufacturing cost.

However, in one embodiment of the disclosed invention, a minute uneven structure is formed in such a manner that granules are scattered in a resin layer, instead of forming the uneven structure on a resin substrate with the use of a mold. Thus, the manufacturing cost of the lighting device can be reduced.

In one embodiment of the disclosed invention, each of the plurality of granules is formed using a resin or glass.

One embodiment of the disclosed invention relates to a lighting device including a light-emitting element layer provided over a substrate; a barrier layer provided over the light-emitting element layer and having a first refractive index; a first resin layer provided over the barrier layer and having the first refractive index; a second resin layer provided over the first resin layer and having a second refractive index which is lower than the first refractive index and higher than a refractive index of the air; a plurality of projections each having an apex provided inside the first resin layer and a flat surface in contact with an interface between the first resin layer and the second resin layer and having the second refractive index; and a resin substrate that is provided over the second resin layer, includes an uneven structure at an interface with the air, and has the second refractive index. A difference in height of unevenness of the uneven structure is greater than a distance from the flat surface to the apex of each of plurality of the projections.

Note that a "projection" in this specification refers to a structure having a flat surface and an apex which is obtained by removing part of a granule (e.g., a spherical granule or a spherical granule which is flattened). As examples of the shape of the projection, a hemispherical shape and a hemispherical shape which is flattened are given.

Light generated in the light-emitting element layer is extracted to the outside (the air) through the barrier layer, the first resin layer, the plurality of projections, the second resin layer, and the resin substrate.

The barrier layer and the first resin layer are formed to have substantially equal refractive indices. In this specification, the refractive index of the barrier layer and the first resin layer is referred to as a first refractive index. The barrier layer and the first resin layer are formed as described above, whereby a relatively large proportion of light passes through the barrier layer and the first resin layer.

The first refractive index is greater than or equal to 1.65 and less than or equal to 2.3, for example. The barrier layer and the first resin layer are formed to have substantially equal refractive indices in this range.

There is a difference between the refractive index of the first resin layer and the refractive index of the second resin layer. However, the plurality of projections with the same refractive index as that of the second resin layer is provided inside the first resin layer. A flat surface of each of the plurality of projections is in contact with the interface between the first resin layer and the second resin layer. Further, an apex of each of the plurality of projections is provided inside the first resin layer.

With the plurality of projections, total reflection of light can be suppressed, so that a larger amount of light can be extracted to the second resin layer. Note that in this specification, the refractive index of the second resin layer, each of the plurality of projections, and the resin substrate is referred to as a second refractive index. The second refractive index is lower than the first refractive index and higher than the refractive index of the air.

The second refractive index is greater than or equal to 1.5 and less than or equal to 1.6, for example, and greater than 1.0 that is the refractive index of the air. The second resin layer, each of the plurality of projections, and the resin substrate are combined to have substantially equal refractive indices in the above range.

Each of the plurality of projections, the second resin layer, and the resin substrate are combined to have substantially equal refractive indices; thus, light extracted to the second resin layer through the plurality of projections reaches the interface between the resin substrate and the air.

Note that a granule whose cross-sectional shape is a circle or an ellipse is used to obtain the projection. As such a granule, a spherical granule and a spherical granule which is flattened are given as examples. Therefore, as examples of the shape of the projection, a hemispherical shape and a hemispherical shape which is flattened are given.

Although there is a difference between the refractive index of the resin substrate and the refractive index of the air, the uneven structure is provided at the interface between the resin substrate and the air, so that total reflection of light can be suppressed and a larger amount of light can be extracted to the air.

One embodiment of the disclosed invention relates to a method for manufacturing a lighting device including the steps of forming a light-emitting element layer and a barrier layer over a substrate; forming an uncured first resin layer over the barrier layer; scattering a plurality of granules that is electrostatically charged over the uncured first resin layer so that part of each of the plurality of granules is embedded in the first resin layer; curing the first resin layer over which the plurality of granules is scattered; forming a second resin layer over the first resin layer which is cured and the plurality of granules so that the other part of each of the plurality of granules is embedded; grinding and polishing the plurality of granules and the second resin layer so that the first resin layer is exposed, thereby forming a plurality of projections that is an unremoved portion of the plurality of granules in the first resin layer; forming a third resin layer over the exposed first resin layer; and forming a resin substrate including an uneven structure at an interface with the air over the third resin layer. Each of the plurality of projections has an apex provided inside the first resin layer and a flat surface in contact with an interface between the first resin layer and the third resin layer. A difference in height of unevenness of the uneven structure is greater than a distance from the flat surface to the apex of each of the plurality of projections. The barrier layer and the first resin layer each have a first refractive index. Each of the plurality of projections, the third resin layer, and the resin substrate each have a second refractive index that is lower than the first refractive index and higher than a refractive index of the air.

In one embodiment of the disclosed invention, the distance from the flat surface to the apex of each of the plurality of projections is greater than or equal to 0.5 μm and less than or equal to 50 μm, and the difference in the height of the unevenness of the uneven structure is greater than or equal to 100 μm and less than or equal to 5 mm.

As a method for forming a minute uneven structure, a method for forming an uneven structure by etching a surface of a resin substrate, a method for forming an uneven structure by stamping with the use of a mold, or the like has been known.

However, in the case of forming such a minute uneven structure with the use of a mold, very high processing accuracy and experiences are required for manufacturing the mold. For this reason, the manufacture of such a mold costs a great deal of money. Moreover, a mold used for forming a minute uneven structure over a large area substrate of lighting or the like also needs to have a large area, which leads to an increase in the manufacturing cost.

However, according to one embodiment of the disclosed invention, the minute uneven structure is formed in such a manner that the granules are scattered, the resin layer is formed to cover the granules, and the resin layer and the granules are grinded and polished, instead of forming the uneven structure on the resin substrate with the use of a mold. For this reason, the manufacturing cost can be reduced.

In one embodiment of the disclosed invention, each of the plurality of projections is formed using a resin or glass.

According to one embodiment of the disclosed invention, it is possible to provide a highly efficient lighting device from which light can be extracted from a light-emitting element efficiently.

According to one embodiment of the disclosed invention, the manufacturing cost of the lighting device can be reduced.

DETAILED DESCRIPTION OF THE INVENTION

Figure 1:
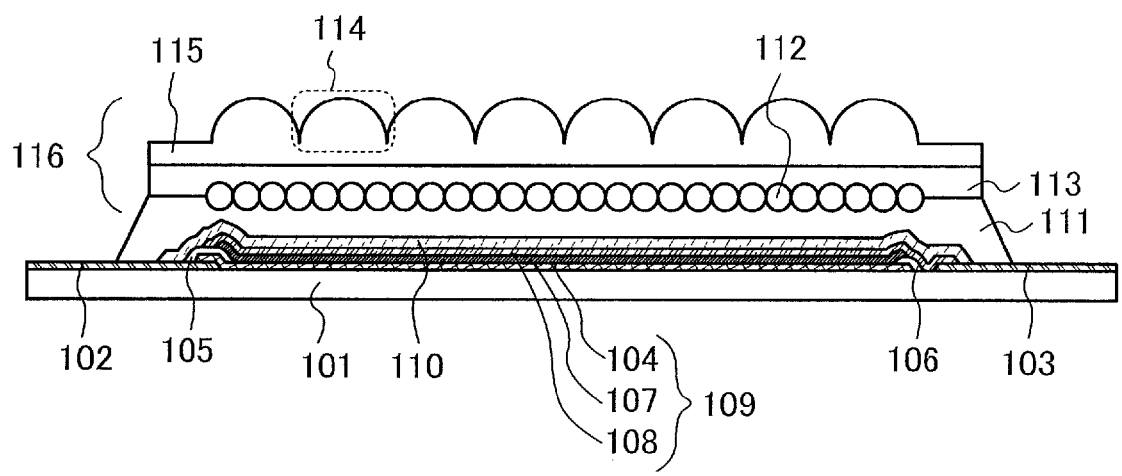
FIG. 1 is a cross-sectional view of a lighting device.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope of the present invention. Therefore, the present invention is not construed as being limited to description of the embodiments. Note that, in the drawings hereinafter shown, the same portions or portions having similar functions are denoted by the same reference numerals, and repeated description thereof will be omitted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]
<Structure of Lighting Device>

FIG. 1 shows a cross-sectional view of a lighting device of this embodiment. The lighting device shown in FIG. 1 includes a substrate 101, a first terminal 102, a second terminal 103, a first electrode 104 electrically connected to the first terminal 102, and a partition wall 105 and a partition wall 106 which are formed to cover edge portions of the first electrode 104. Further, the lighting device shown in FIG. 1 includes an EL layer 107 provided over the first electrode 104, the partition wall 105, and the partition wall 106, and a second electrode 108 provided over the EL layer 107 and the partition wall 106 and electrically connected to the second terminal 103. The first electrode 104, the EL layer 107, and the second electrode 108 form a light-emitting element layer 109.

Note that in the lighting device shown in FIG. 1, one light-emitting element layer 109 is provided as an example; however, the present invention is not limited to this. In the lighting device of this embodiment, a plurality of light-emitting element layers connected in series may be provided.

In addition, a barrier layer 110 is provided to cover the light-emitting element layer 109. The barrier layer 110 prevents moisture or an impurity from entering the light-emitting element layer 109, particularly the EL layer 107, from the outside. Note that the barrier layer 110 may have a single-layer structure or a stacked-layer structure in which a plurality of layers is stacked.

A resin layer 111 having the same refractive index (the first refractive index) as that of the barrier layer 110 is provided over the barrier layer 110, the first terminal 102, and the second terminal 103. A high refractive index resin is used for the resin layer 111. Thus, it is possible to prevent total reflection of light generated in the light-emitting element layer 109 at the interface between the barrier layer 110 and the resin layer 111, so that a larger amount of light can be extracted to the resin layer 111.

The first refractive index is greater than or equal to 1.65 and less than or equal to 2.3, for example. The barrier layer 110 and the resin layer 111 are formed to have substantially equal refractive indices in this range.

Note that a drying agent may be contained in the resin layer 111. When the drying agent is contained in the resin layer 111, the drying agent absorbs moisture from the outside, so that an effect of preventing moisture from being mixed into the light-emitting element layer 109 is improved.

A plurality of granules 112 is arranged between the resin layer 111 and a resin layer 113 which is described later. Part of each of the plurality of granules 112 is embedded in the resin layer 111. The other part of each of the plurality of granules 112 is embedded in the resin layer 113.

As the granule 112, a granule whose cross-sectional shape is a circle or an ellipse at the interface between the resin layer 111 and the resin layer 113 and at a plane perpendicular to the interface between the resin layer 111 and the resin layer 113 is used. As such a granule 112, a spherical granule or a spherical granule which is flattened is given, for example.

The granule 112 is formed of a resin or glass having the second refractive index. The granule 112 is embedded in the resin layer 111 and the resin layer 113. The distance from an apex of the granule 112 to the interface between the resin layer 111 and the resin layer 113 is greater than or equal to 0.5 μm and less than or equal to 50 μm, preferably greater than or equal to 1 μm and less than or equal to 10 μm.

Light generated in the light-emitting element layer 109 passes through the resin layer 111 formed using a high refractive index resin. The resin layer 113 provided over the resin layer 111 is formed using a resin having a lower refractive index than that of the resin layer 111 (i.e., the second refractive index); therefore, there is a difference between the refractive indices of the resin layer 111 and the resin layer 113. When such a difference between the refractive indices of the resin layer 111 and the resin layer 113 arises, light might be totally reflected at the interface between the resin layer 111 and the resin layer 113. When light is totally reflected at the interface between the resin layer 111 and the resin layer 113, a larger amount of light cannot be extracted to the outside, which is unfavorable for a lighting device.

However, as described above, the granule 112 is embedded between the resin layer 111 and the resin layer 113. Therefore, total reflection of light at the interface between the resin layer 111 and the resin layer 113 can be prevented, resulting in an improvement of the light extraction efficiency.

In addition, the resin layer 113 has a function of bonding a resin substrate 115 having a plurality of microlenses 114 and the resin layer 111.

The resin substrate 115 is formed using a material having a refractive index substantially the same as that of the resin layer 113 (i.e., the second refractive index) and has the plurality of microlenses 114 on its surface which is in contact with the air (i.e., a surface opposite to a surface in contact with the resin layer 113), as described above. In other words, with the arrangement of the plurality of microlenses 114 at the interface between the resin substrate 115 and the air, an uneven structure is provided at the interface between the resin substrate 115 and the air.

The second refractive index is greater than or equal to 1.5 and less than or equal to 1.6, for example, and greater than 1.0 that is the refractive index of the air. The resin layer 113, each of the plurality of granules 112, and the resin substrate 115 are combined to have substantially equal refractive indices in the above range.

The diameter of the microlens 114 is greater than that of the granule 112. Note that in this embodiment, the plurality of granules 112, the resin layer 113, and the resin substrate 115 having the plurality of microlenses 114 are collectively referred to as a microlens array 116.

The resin layer 113 and the resin substrate 115 are formed using materials having substantially the same refractive index, whereby total reflection of light from the light-emitting element layer 109 is suppressed, and the light from the light-emitting element layer 109 passes through the resin layer 113 and the resin substrate 115 in this order.

Since the refractive index of the resin substrate 115 is higher than that of the air, there is a difference between the refractive indices of the resin substrate 115 and the air. When such a difference between the refractive indices of the resin substrate 115 and the air arises, light might be totally reflected at the interface between the resin substrate 115 and the air. When light is totally reflected at the interface between the resin substrate 115 and the air, a larger amount of light cannot be extracted to the outside, which is unfavorable for a lighting device.

However, as described above, the microlens 114 is provided on a surface where the resin substrate 115 is in contact with the air; that is, an uneven structure is formed at the interface between the resin substrate 115 and the air. Therefore, total reflection of light at the interface between the resin substrate 115 and the air can be prevented, resulting in an improvement of the light extraction efficiency.

Note that the lighting device in this embodiment is a lighting device having a so-called top emission structure in which light from the light-emitting element layer 109 is emitted to a side opposite to the substrate 101 side.

<Method for Manufacturing Microlens Array>

Figure 2A:
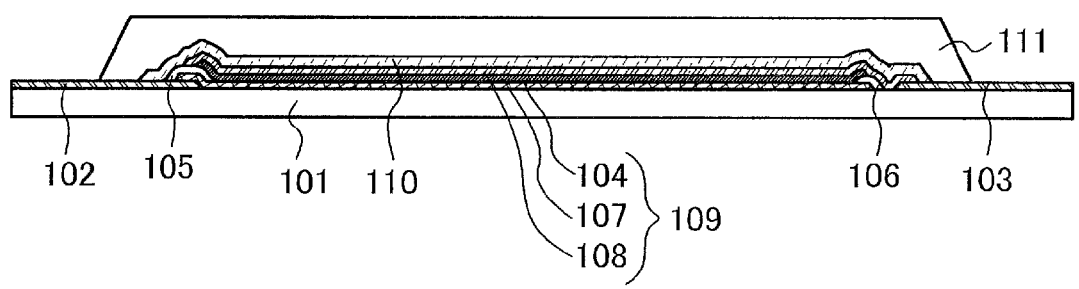
FIGS. 2A to 2C are cross-sectional views showing a manufacturing process of a lighting device.

The resin layer 111 is formed over the light-emitting element layer 109 and the barrier layer 110 (see FIG. 2A). Note that the resin layer 111 is in an uncured state at this time.

Next, the plurality of granules 112 which is electrostatically charged is scattered over the resin layer 111 in an uncured state. At this time, the plurality of granules 112 is scattered so that part of each of the granules 112 is embedded in the resin layer 111 in an uncured state. In order to scatter the plurality of granules 112 so that part of each of the granules 112 is embedded in the resin layer 111 in an uncured state, for example, a method in which the granule 112 is supplied with kinetic energy so as to be embedded in the resin layer 111 or a method in which a difference between specific gravities of the granule 112 and the resin layer 111 is utilized so that the granule 112 is embedded is given. Alternatively, if necessary, after the granules 112 are scattered over the resin layer 111 in an uncured state, an upper portion of the granule 112 is pushed with a roller or the like so as to be embedded in the resin layer 111. Then, the resin layer 111 in an uncured state is cured (see FIG. 2B).

A resin that is a material of the resin layer 113 in an uncured state is applied over the resin layer 111 in which the granule 112 is embedded, and then the resin is cured by heat treatment or the like. Thus, the resin layer 113 is formed (see FIG. 2C).

Moreover, the resin substrate 115 having the microlens 114 is bonded to the resin layer 113, so that the microlens array 116 is formed (see FIG. 1).

Alternatively, after the resin that is the material of the resin layer 113 in an uncured state is applied, the resin substrate 115 having the microlens 114 is arranged over the resin layer 113, and then the resin that is the material of the resin layer 113 is cured and the resin substrate 115 is bonded to the resin layer 113 by heat treatment or the like (see FIG. 1).

Through the above steps, the microlens array 116 is formed over the light-emitting element layer 109.

As the substrate 101, a substrate having a barrier property to moisture, such as a metal substrate of stainless steel, tungsten (W), nickel (Ni), aluminum (Al), or the like; a glass substrate; a ceramic substrate; or the like, is used. When the substrate having a barrier property to moisture is used as the substrate 101, moisture can be prevented from being mixed into the light-emitting element layer 109 from the substrate 101 side. Note that the lighting device in this embodiment has a top emission structure as described above, whereby a substrate having a light-blocking property can be used as the substrate 101. In this embodiment, a stainless steel substrate is used as the substrate 101.

Examples of the materials of the first terminal 102 and the second terminal 103 include copper (Cu), titanium (Ti), tantalum (Ta), tungsten (W), molybdenum (Mo), chromium (Cr), neodymium (Nd), scandium (Sc), and nickel (Ni), and an alloy material containing any of these materials as its main component. A single film of any of the above materials or a stacked layer of any of the above materials may be used for the first terminal 102 and the second terminal 103.

The first electrode 104 is provided on the side opposite to a side where light is extracted and is formed using a reflective material. As the reflective material, a metal material such as aluminum, gold, platinum, silver, nickel, tungsten, chromium, molybdenum, iron, cobalt, copper, or palladium can be used. Other than the above, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

As a material of the partition wall 105 and the partition wall 106, for example, an organic resin such as polyimide, acrylic, polyamide, or epoxy or an inorganic insulating material can be used.

There is no particular limitation on the method for forming the partition wall 105 and the partition wall 106. A sputtering method, an evaporation method, a droplet discharging method (e.g., an inkjet method), a printing method (e.g., a screen printing method or an offset printing method), or the like may be used.

The EL layer 107 includes at least a layer containing a light-emitting organic compound. In addition, the EL layer 107 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of EL layers is provided between the first electrode 104 and the second electrode 108 can be used. A stacked-layer structure of two layers, three layers, or four layers (in particular, a stacked-layer structure of three layers) is preferably used. Detailed description of the structural example of the EL layer 107 will be made later on.

As a light-transmitting material for the second electrode 108, indium oxide, indium oxide-tin oxide (ITO), indium oxide-zinc oxide, zinc oxide, zinc oxide to which gallium is added, graphene, or the like can be used.

As the barrier layer 110 covering the light-emitting element layer 109, an aluminum oxide film, a silicon nitride film, a silicon oxynitride film, or the like, which can prevent moisture from being mixed into the outside is used. The barrier layer 110 is formed to have a thickness greater than or equal to 5 nm and less than or equal to 500 nm, preferably 100 nm. The barrier layer 110 is formed to have a refractive index substantially equal to the refractive index of the light-emitting element layer 109. These films each have a refractive index greater than or equal to 1.65 and less than or equal to 2.3. The barrier layer 110 is formed to have a refractive index in this range and substantially equal to the refractive index of the light-emitting element layer 109. Therefore, a relatively large proportion of light emitted from the light-emitting element layer 109 passes through the barrier layer 110.

In the case of using a silicon nitride film as the barrier layer 110, a silicon nitride film formed by a surface wave plasma CVD method is preferably used. Surface wave plasma is high-density plasma with large area generated by utilizing a surface wave that is an electromagnetic wave propagated through a surface of a dielectric plate. Since the surface plasma is generated by electrodeless discharge, a substrate can be placed in a position sufficiently far from a high-energy portion of the plasma, so that a condition with less plasma damage can be obtained. The silicon nitride film formed by the surface wave plasma CVD method is preferable as the barrier layer 110 because of its high barrier property, i.e., low water transmission rate of approximately $10^{-7}$ g/m$^2$·day. In addition, the light transmittance of the silicon nitride film formed by the surface wave plasma CVD method is greater than 90% (thickness thereof is 2 μm), so that the light transmittance is high.

The resin layer 111 is formed using a high refractive index resin. For example, a thermosetting high refractive index resin material or a UV curable high refractive index resin material can be used.

The resin layer 111 is formed to have a refractive index substantially equal to those of the light-emitting element layer 109 and the barrier layer 110. For example, a resin having a refractive index greater than or equal to 1.65 and less than or equal to 2.3 is used to form the resin layer 111 having a refractive index in this range and substantially equal to those of the light-emitting element layer 109 and the barrier layer 110. Therefore, a relatively large proportion of light emitted from the light-emitting element layer 109 passes through the resin layer 111.

Further, when a drying agent is contained in the resin layer 111, moisture can be prevented from being mixed into the light-emitting element layer 109 even in the case where moisture is mixed from the resin substrate 115 side.

Figure 3:
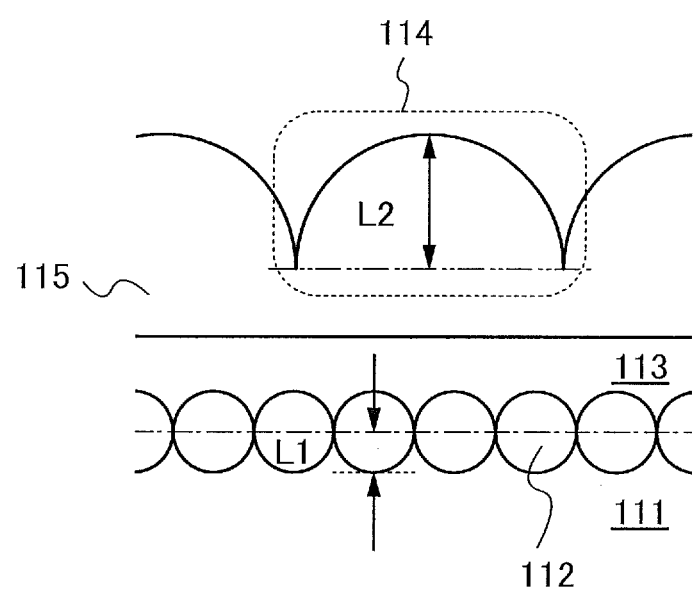
FIG. 3 is a cross-sectional view of a lighting device.

The plurality of granules 112 are formed using a resin or glass having a refractive index substantially the same as that of the resin substrate 115. As such a resin, polyethylene terephthalate, polypropylene, nylon, or the like can be used, for example. A distance L1 from the interface between the resin layer 111 and the resin layer 113 (A dot-dashed line in FIG. 3. Note that FIG. 3 is an enlarged view of part of FIG. 1) to an apex of the granule 112 (a dotted line in FIG. 3) in the resin layer 111 is greater than or equal to 0.5 μm and less than or equal to 50 μm, preferably greater than or equal to 1 μm and less than or equal to 10 μm. The diameter of the granule 112 may be selected so that the distance L1 has the above value. In this embodiment, a bead formed of polyethylene terephthalate whose diameter is 6 μm is used as the granule 112.

The resin layer 113 is formed using a resin having substantially the same refractive index as those of the resin substrate 115 and the granule 112. As the resin layer 113, an organic resin such as epoxy can be used.

Note that the granule 112 and the resin layer 113 each have substantially the same refractive index as that of the resin substrate 115, so that there are a difference between the refractive indices of the resin layer 111 and the granule 112 and a difference between the refractive indices of the resin layer 111 and the resin layer 113. However, the plurality of granules 112 is provided at the interface between the resin layer 111 and the resin layer 113; therefore, the reflection angle of light which is generated in the light-emitting element layer 109 and passes through the resin layer 111 is changed by the plurality of granules 112. Consequently, light can be extracted from the resin layer 111 to the resin layer 113 through the granules 112.

The resin substrate 115 having the plurality of microlenses 114 is formed with the use of a mold provided with an uneven structure. Resin pellets are arranged so that the resin pellets are embedded inside the uneven structure, and a resin sheet is provided over the arranged resin pellets. The resin pellets and the resin sheet are subjected to pressure treatment while being heated; thus, the resin substrate 115 having the plurality of microlenses 114 can be manufactured.

For the resin pellets and the resin sheet, a material which has a light-transmitting property and can be shaped as desired is used. In particular, a material transmitting visible light is preferably used. For example, an acrylic resin (a polymethyl methacrylate resin), a cyclic olefin copolymer resin, a cyclo olefin polymer resin, a polyester resin, a polyacrylonitrile resin, a polyimide resin, a polycarbonate resin, a polyethersulfone resin, a polyamide resin, a polystyrene resin, a polyamide imide resin, a polyvinylchloride resin, a polyethylene terephthalate resin, or a combination of these resins can be used. In addition, the visible light transmittance of the material is preferably greater than or equal to 85% in order to improve light extraction efficiency. An acrylic resin is preferable because of its high visible light transmittance. Further, a cyclic olefin copolymer resin and a cyclo olefin polymer resin are preferable because of their high visible light transmittance and heat resistance.

As described above, the uneven structure provided on the mold determines the shape and size of the microlens 114.

The plurality of microlenses 114 arranged in a matrix is preferable although the plurality of microlenses 114 arranged in a stripe is also effective. The cross-sectional shape of the microlens 114 is not particularly limited and for example, a hemisphere or a shape with an apex can be used. Examples of the cross-sectional shape with an apex include a circular cone, a pyramid (e.g., a triangular pyramid, a square pyramid, or a hexagonal pyramid), and the like.

The difference in the height of the unevenness of the microlens 114 (a distance L2 in FIG. 3) is the peak-to-valley (PV) value of the uneven structure, and is preferably greater than or equal to 100 μm and less than or equal to 5 mm, more preferably greater than or equal to 300 μm and less than or equal to 1 mm Note that in this specification, a PV value refers to the maximum height from the bottom to an apex of the unevenness (i.e., the maximum difference in the height of the unevenness).

Note that the distance from the interface between the resin layer 111 and the resin layer 113 (a dot-dashed line in FIG. 3) to a bottom surface of the microlens 114 (a two-dot-dashed line in FIG. 3) is preferably greater than or equal to 0 μm and less than or equal to 1 mm, more preferably greater than or equal to 50 μm and less than or equal to 250 μm. As the distance between the granule 112 and the microlens 114 shortens, the spread of light in a horizontal direction through the resin layer 113 or the resin substrate 115 can be prevented.

According to this embodiment, the microlens array 116 with which light can be extracted from the light-emitting element layer 109 more efficiently can be manufactured in a simple process.

Further, according to this embodiment, the manufacturing cost of the microlens array 116 can be reduced.

Furthermore, according to this embodiment, the minute uneven structure can be formed using the granule 112 and the large uneven structure (the microlens 114) can be formed by using the mold; therefore, the manufacturing cost can be reduced and the productivity can be increased.

<Detailed Description of EL Layer>

Figure 4A:
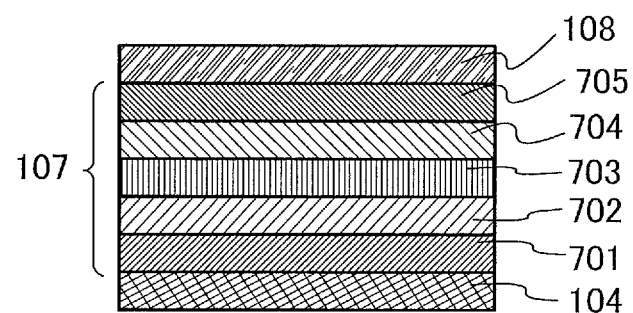
FIGS. 4A and 4B are cross-sectional views of EL layers.

As the EL layer 107, an electron-injection layer 701, an electron-transport layer 702, a layer 703 containing a light-emitting organic compound, a hole-transport layer 704, and a hole-injection layer 705 are stacked between the first electrode 104 and the second electrode 108 in this order from the first electrode 104 side (see FIG. 4A).

The electron-injection layer 701 is a layer that includes a substance with a high electron-injection property. For the electron-injection layer 701, an alkali metal, an alkaline-earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of substances for forming the electron-transport layer 702, which is to be described later, can also be used.

The electron-transport layer 702 is a layer containing a substance with a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility greater than or equal to $10^{-6}$ cm$^2$/Vs. The electron-transport layer 702 is not limited to a single layer, but two or more layers containing the aforementioned substances may be stacked.

For the layer 703 containing a light-emitting organic compound, a fluorescent compound which exhibits fluorescence or a phosphorescent compound which exhibits phosphorescence can be used.

The fluorescent compound that can be used for the layer 703 containing a light-emitting organic compound will be given. Examples of the fluorescent materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation:

PCBAPA), and the like. In addition, examples of the materials that emit green light include N-(9,10-diphenyl-2-anthryl)-N, 9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the materials that emit yellow light include rubrene, 5,12-bis(1,1'-biphenyl-4-yl)-6,11-diphenyltetracene (abbreviation: BPT), and the like. Furthermore, examples of materials that emit red light include N,N,N',N'-tetrakis(4-methylphenyl)tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), and the like.

The phosphorescent compounds that can be used for the layer 703 containing a light-emitting organic compound will be given. Examples of the materials that emit blue light include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(III) picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIr(acac)), and the like. Examples of the materials that emit green light include tris(2-phenylpyridinato-N,$C^{2'}$)iridium(III) (abbreviation: Ir(ppy)$_3$), bis(2-phenylpyridinato-N,$C^{2'}$)iridium(III) acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,$C^{2'}$)iridium(III) acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include the following organometallic complexes: bis[2-(2'-benzo[4,5-a]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium (III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as a phosphorescent compound.

Note that the layer 703 containing a light-emitting organic compound may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{1-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization may be further added. In addition, NPB, Alq, or the like may be further added in order to transfer energy efficiently to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]}(abbreviation: TAB-PFH), and the like. Examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1, 4-phenylene)], or the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1, 4-phenylene]} (abbreviation: CN-PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. In other words, when lights obtained from substances which emit complementary colors are mixed, white emission can be obtained. This can be applied to a light-emitting element including three or more layers each containing a light-emitting organic compound.

The hole-transport layer 704 is a layer containing a substance with a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility greater than or equal to $10^{-6}$ cm$^2$/Vs. It is to be noted that a substance other than the above may be used as long as it has a higher hole transport property than an electron transport property. The layer containing a substance having a high hole transport property is not limited to a single layer, and may be a stack of two or more layers containing any of the above substances.

For the hole-transport layer 704, a carbazole derivative such as CBP, CzPA, or PCzPA or an anthracene derivative such as t-BuDNA, DNA, or DPAnth may be used.

For the hole-transport layer 704, a high molecular compound such as PVK, PVTPA, PTPDMA, or Poly-TPD can be used.

The hole-injection layer 705 is a layer containing a substance with a high hole-injection property. As the substance with a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: H$_2$Pc), or copper(II) phthalocyanine (abbreviation: CuPc) can also be used.

Alternatively, the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)-amino]-9-phenylcarbazole (abbreviation: PCzPCN1), or the like.

Further alternatively, any of high molecular compounds (e.g., oligomers, dendrimers, or polymers) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N-bis(4-butylphenyl)-N,N-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 705, a composite material in which an acceptor substance is mixed with an organic compound having a high hole-transport property is preferably used. With the use of the composite material in which an acceptor substance is mixed with a substance having a high hole-transport property, excellent hole injection from the second electrode 108 can be obtained, which results in a reduction in the driving voltage of the light-emitting element. Such a composite material can be formed by co-evaporation of a substance having a high hole-transport property and a substance having an acceptor property. When the hole-injection layer 705 is formed using the composite material, holes are easily injected from the second electrode 108 into the EL layer 107.

As the organic compound for the composite material, various compounds such as an aromatic amine compound, carbazole derivatives, aromatic hydrocarbon, and a high molecular compound (such as oligomers, dendrimers, or polymers) can be used. The organic compound used for the composite material is preferably an organic compound having a high hole-transport property. Specifically, a substance having a hole mobility greater than or equal to $10^{-6}$ cm$^2$/Vs is preferably used. It is to be noted that a substance other than the above may be used as long as it has a higher hole transport property than an electron transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'- bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)-phenyl]-2,3,5,6-tetraphenylbenzene.

Further, it is possible to use the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, or the like.

Furthermore, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the electron acceptor, organic compounds such as 7,7,8,8-tetracyano-2,3,5,6-tetrafluoroquinodimethane (abbreviation: F$_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

Note that the hole injection layer 705 may be formed using a composite material of the high molecular compound such as PVK, PVTPA, PTPDMA, or Poly-TPD, and the electron acceptor.

Note that the electron-injection layer 701, the electron-transport layer 702, the layer 703 containing a light-emitting organic compound, the hole-transport layer 704, and the hole-injection layer 705 which are described above can each be formed by a method such as an evaporation method (e.g., a vacuum evaporation method), an inkjet method, or a coating method.

Figure 4B:
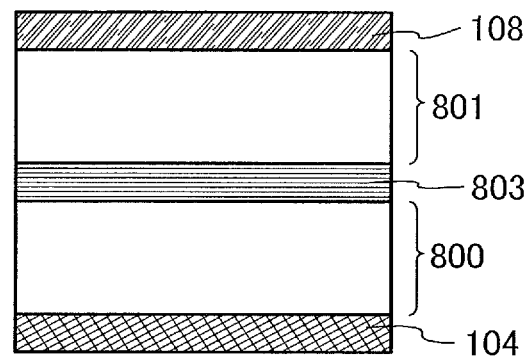

Note that a plurality of the EL layers 107 may be stacked between the first electrode 104 and the second electrode 108, as shown in FIG. 4B. In that case, a charge generation layer 803 is preferably provided between a first EL layer 800 and a second EL layer 801 which are stacked. The charge generation layer 803 can be formed using the above-mentioned composite material. Further, the charge generation layer 803 may have a stacked structure including a layer containing the composite material and a layer containing another material. With such a structure, problems such as energy transfer and quenching less occur, and the range of choices of materials of a light-emitting element is widened, which easily enables both high light emission efficiency and long lifetime to be provided for the light-emitting element. Moreover, a light-emitting element which provides phosphorescence from one of the EL layers and fluorescence from the other of the EL layers can be readily obtained. This structure can be combined with the above-mentioned structures of the EL layer.

Further, when emission colors of EL layers are made different, light emission of a desired color can be obtained from the light-emitting element as a whole. For example, the emission colors of first and second EL layers are complementary in a light-emitting element having the two EL layers, so that the light-emitting element can be made to emit white light as a whole. Note that "complementary colors" refer to colors that can produce an achromatic color when mixed. In other words, when lights obtained from substances which emit complementary colors are mixed, white emission can be obtained. Further, the same applies to a light-emitting element having three or more EL layers.

Thus, the EL layer 107 can be manufactured.

According to this embodiment, it is possible to provide a highly efficient lighting device using the microlens array 116 with which light can be extracted from the light-emitting layer 109 efficiently.

Further, according to this embodiment, the manufacturing cost of the lighting device including the microlens array 116 can be reduced.

[Embodiment 2]
<Structure of Lighting Device>

Figure 5:
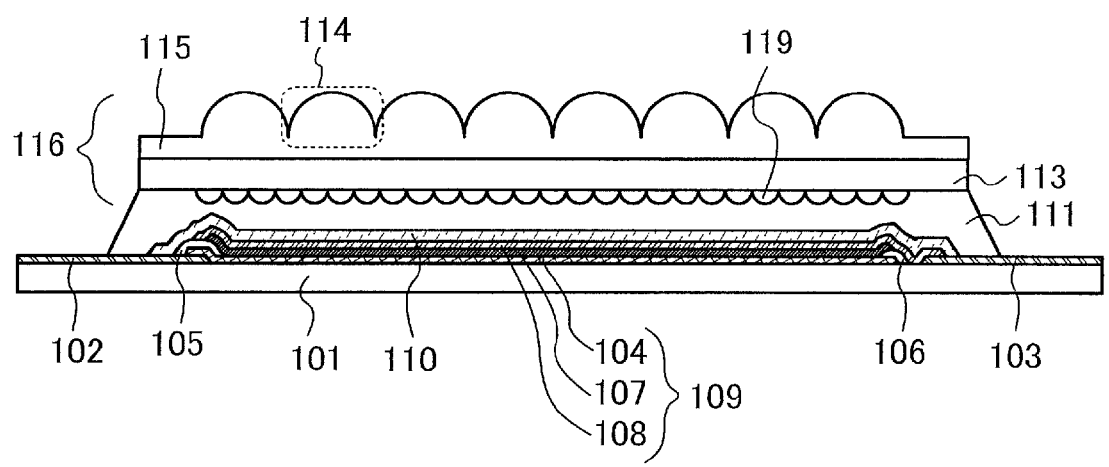
FIG. 5 is a cross-sectional view of a lighting device.

FIG. 5 shows a cross-sectional view of a lighting device of this embodiment. The lighting device shown in FIG. 5 includes the substrate 101, the first terminal 102, the second terminal 103, the first electrode 104 electrically connected to the first terminal 102, and the partition wall 105 and the partition wall 106 which are formed to cover edge portions of the first electrode 104. Further, the lighting device shown in FIG. 5 includes the EL layer 107 provided over the first electrode 104, the partition wall 105, and the partition wall 106, and the second electrode 108 provided over the EL layer 107 and the partition wall 106 and electrically connected to the second terminal 103. The first electrode 104, the EL layer 107, and the second electrode 108 form the light-emitting element layer 109.

Note that in the lighting device shown in FIG. 5, one light-emitting element layer 109 is provided as an example; however, the present invention is not limited to this. In the lighting device of this embodiment, a plurality of light-emitting element layers connected in series may be provided.

In addition, the barrier layer 110 is provided to cover the light-emitting element layer 109. The barrier layer 110 prevents moisture or an impurity from entering the light-emitting element layer 109, particularly the EL layer 107, from the outside. Note that the barrier layer 110 may have a single-layer structure or a stacked-layer structure in which a plurality of layers is stacked.

The resin layer 111 with the same refractive index (the above-described first refractive index) as that of the barrier layer 110 is provided over the barrier layer 110, the first terminal 102, and the second terminal 103. A high refractive index resin is used for the formation of the resin layer 111. Thus, it is possible to prevent total reflection of light generated in the light-emitting element layer 109 at the interface between the barrier layer 110 and the resin layer 111, so that a larger amount of light can be extracted to the resin layer 111.

The first refractive index is greater than or equal to 1.65 and less than or equal to 2.3, for example. The barrier layer 110 and the resin layer 111 are formed to have substantially equal refractive indices in this range.

Note that a drying agent may be contained in the resin layer 111. When the drying agent is contained in the resin layer 111, the drying agent absorbs moisture from the outside, so that an effect of preventing moisture from being mixed into the light-emitting element layer 109 is improved.

As a projection 119, a projection whose cross-sectional shape is a circle or an ellipse at the interface between the resin layer 111 and the resin layer 113 is used. In addition, a granule whose cross-sectional shape is a semicircle or a semiellipse at a surface perpendicular to the interface between the resin layer 111 and the resin layer 113 is used. As such a projection 119, a hemispherical granule or a hemispherical granule which is flattened is given, for example.

The projection 119 is formed of a resin or glass having the second refractive index which is lower than the first refractive index and higher than the refractive index of the air. An apex of the projection 119 is provided in the resin layer 111 and a flat surface of the projection 119 is in contact with the interface between the resin layer 111 and the resin layer 113. The distance from the flat surface to the apex of the projection 119 is preferably greater than or equal to 0.5 µm and less than or equal to 50 µm, more preferably greater than or equal to 1 µm and less than or equal to 10 µm.

Light generated in the light-emitting element layer 109 passes through the resin layer 111 formed using a high refractive index resin. The resin layer 113 provided over the resin layer 111 is formed using a resin having a lower refractive index than that of the resin layer 111 (i.e., the second refractive index); therefore, there is a difference between the refractive indices of the resin layer 111 and the resin layer 113. When such a difference between the refractive indices of the resin layer 111 and the resin layer 113 arises, light might be totally reflected at the interface between the resin layer 111 and the resin layer 113. When light is totally reflected at the interface between the resin layer 111 and the resin layer 113, a larger amount of light cannot be extracted to the outside, which is unfavorable for a lighting device.

However, as described above, the apex of the projection 119 is provided inside the resin layer 111 and the flat surface of the projection 119 is provided to be in contact with the interface between the resin layer 111 and the resin layer 113. Therefore, total reflection of light at the interface between the resin layer 111 and the resin layer 113 can be prevented, resulting in an improvement of the light extraction efficiency.

In addition, the resin layer 113 has a function of bonding a resin substrate 115 having a plurality of microlenses 114 and the resin layer 111.

The resin substrate 115 is formed using a material having substantially the same refractive index as that of the resin layer 113 (i.e., the second refractive index) and has the plurality of microlenses 114 on its surface which is in contact with the air (i.e., a surface opposite to a surface in contact with the resin layer 113), as described above. In other words, with the arrangement of the plurality of microlenses 114 at the interface between the resin substrate 115 and the air, an uneven structure is provided at the interface between the resin substrate 115 and the air.

The second refractive index is greater than or equal to 1.5 and less than or equal to 1.6, for example, and greater than 1.0 that is the refractive index of the air. The resin layer 113, the projection 119, and the resin substrate 115 are combined to have substantially equal refractive indices in the above range.

The difference in the height of the microlense 114 is greater than the distance between the flat surface and the apex of the projection 119. Note that in this embodiment, a plurality of projections 119, the resin layer 113, and the resin substrate 115 having the plurality of microlenses 114 are collectively referred to as the microlens array 116.

The resin layer 113 and the resin substrate 115 are formed using materials having substantially the same refractive index, whereby total reflection of light from the light-emitting element layer 109 is suppressed, and the light passes through the resin layer 113 and the resin substrate 115.

Since the refractive index of the resin substrate 115 is higher than that of the air, there is a difference between the refractive indices of the resin substrate 115 and the air. When such a difference between the refractive indices of the resin substrate 115 and the air arises, light might be totally reflected at the interface between the resin substrate 115 and the air. When light is totally reflected at the interface between the resin substrate 115 and the air, a larger amount of light cannot be extracted to the outside, which is unfavorable for a lighting device.

However, as described above, the microlens 114 is provided on a surface where the resin substrate 115 is in contact with the air; that is, an uneven structure is formed at the interface between the resin substrate 115 and the air. Therefore, total reflection of light at the interface between the resin substrate 115 and the air can be prevented, resulting in an improvement of the light extraction efficiency.

Note that the lighting device in this embodiment is a lighting device having a so-called top emission structure in which light from the light-emitting element layer 109 is emitted to a side opposite to the substrate 101 side.

<Method for Manufacturing Microlens Array>

Figure 6A:
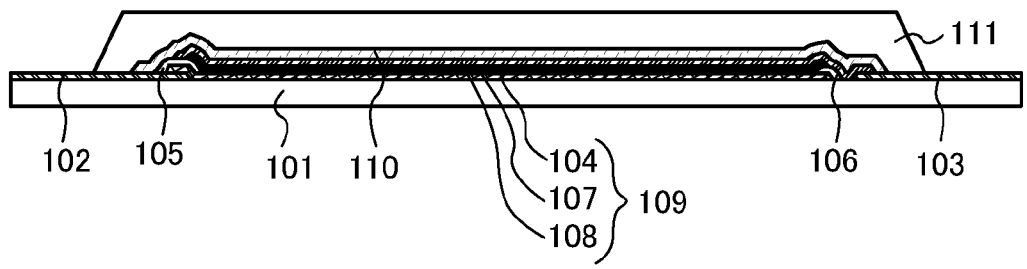
FIGS. 6A to 6E are cross-sectional views showing a manufacturing process of a lighting device.

The resin layer 111 is formed over the light-emitting element layer 109 and the barrier layer 110 (see FIG. 6A). Note that the resin layer 111 is in an uncured state at this time.

Figure 6B:
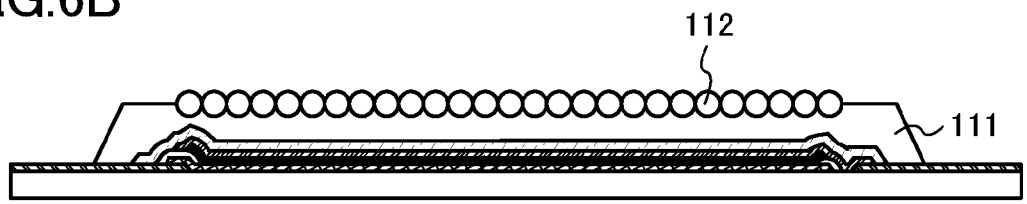

Next, the plurality of granules 112 which is electrostatically charged is scattered over the resin layer 111 in an uncured state. At this time, the plurality of granules 112 is scattered so that part of each of the granules 112 is embedded in the resin layer 111 in an uncured state. In order to scatter the plurality of granules 112 so that part of each of the granules 112 is embedded in the resin layer 111 in an uncured state, for example, a method in which the granule 112 is supplied with kinetic energy so as to be embedded in the resin layer 111 or a method in which a difference between specific gravities of the granule 112 and the resin layer 111 is utilized so that the granule 112 is embedded is given. Alternatively, if necessary, after the granules 112 are scattered in the resin layer 111 in an uncured state, an upper portion of the granule 112 is pushed with a roller or the like so as to be embedded in the resin layer 111. Then, the resin layer 111 in an uncured state is cured (see FIG. 6B).

Figure 6C:
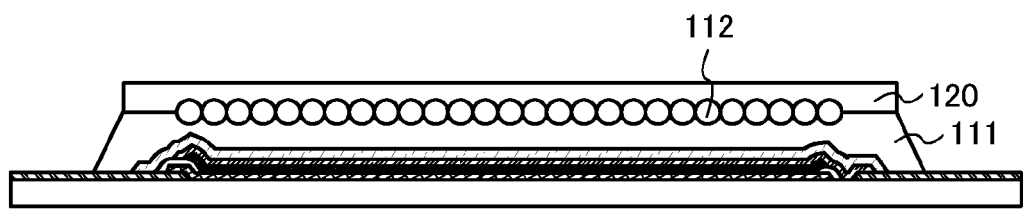

A resin that is a material of a resin layer 120 in an uncured state is applied over the resin layer 111 in which the granule 112 is embedded, and then the resin is cured by heat treatment or the like (see FIG. 6C). Note that a material similar to that of the resin layer 113 described later is preferably used for the resin layer 120. Thus, the other part of the granule 112, which is not embedded in the resin layer 111, is embedded in the resin layer 120. The resin layer 120 has a function of fixing the granule 112, whereby the other part of the granule 112, which is not embedded in the resin layer 111, can be easily grinded and polished.

Figure 6D:
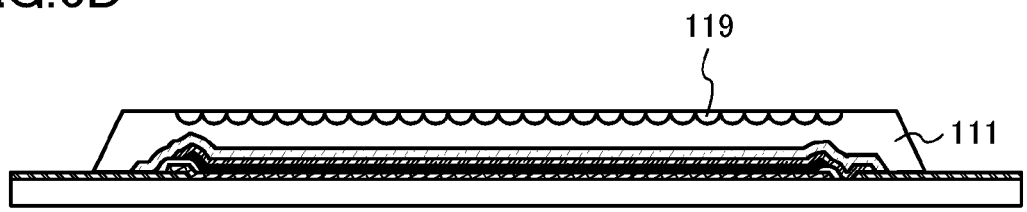

Next, the resin layer 120 and the other part of the granule 112, which is not embedded in the resin layer, are grinded and polished, and then the resin layer 120 and the other part of the granule 112, which is not embedded in the resin layer 111, are removed (see FIG. 6D). Thus, the resin layer 111 is exposed and the part of the granule 112, which is embedded in the resin layer 111 remains. In this embodiment, the remaining portion of the granule 112, which is embedded in the resin layer 111, is referred to as the projection 119. Since the projection 119 is the granule 112 which is grinded and polished, the flat surface of the projection 119 and a surface of the exposed resin layer 111 are at the same level in height. Apexes of the plurality of the projections 119 are arranged inside the resin layer 111.

An apparatus for polishing a glass substrate or a silicon substrate is used for polishing and grinding. For example, the following method may be employed in which an object to be processed is placed on a surface plate and is grinded with abrasive granules while being pressed. First, rough grinding is performed, and then finishing polishing is performed.

Figure 6E:
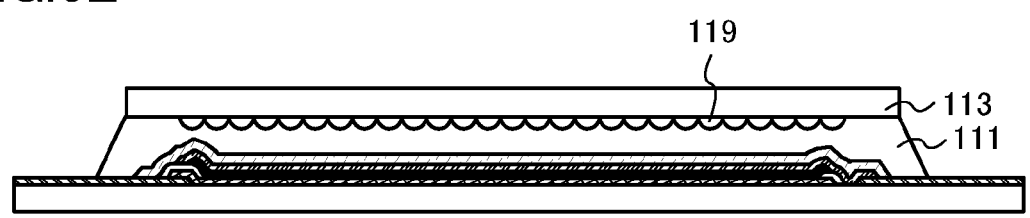

Next, the resin layer 113 is formed over the resin layer 120 which is grinded and polished and the resin layer 111 (see FIG. 6E). As described above, the flat surface of the projection 119 and the surface of the exposed resin layer 111 are at the same level in height, so that the flat surface of the projection 119 and the interface between the resin layer 111 and the resin layer 113 are at the same level in height. That is, the flat surface of the projection 119 is in contact with the interface between the resin layer 111 and the resin layer 113.

Moreover, the resin substrate 115 having the microlens 114 is bonded to the resin layer 113, so that the microlens array 116 is formed (see FIG. 5).

Alternatively, after the resin that is the material of the resin layer 113 in an uncured state is applied, the resin substrate 115 having the microlens 114 is arranged over the resin layer 113, and then the resin that is the material of the resin layer 113 is cured and the resin substrate 115 is bonded to the resin layer 113 by heat treatment or the like (see FIG. 5).

Further, as another method for manufacturing the microlens array 116, the following method is given. After the formation of the resin layer 111, the granules 112 are not embedded in the resin layer 111 but are scattered over a surface of the resin layer 111. The granules 112 are scattered over the surface of the resin layer 111, and then a resin layer formed of a material similar to that of the resin layer 111 (hereinafter referred to as an additional resin layer 111) is formed to cover the granule 112. Part of the additional resin layer 111 and part of the granule 112 are grinded and polished.

After the additional resin layer 111 and the granule 112 are grinded and polished, the resin layer 113 and the resin substrate 115 having the microlens 114 are formed, so that the microlens array 116 can be manufactured.

In the case of manufacturing the microlens array 116 through this manufacturing method, formation of the resin layer 120 is unnecessary.

Through the above steps, the microlens array 116 is formed over the light-emitting element layer 109.

As the substrate 101, a substrate having a barrier property to moisture, such as a metal substrate of stainless steel, tungsten (W), nickel (Ni), aluminum (Al), or the like; a glass substrate; a ceramic substrate; or the like, is used. When the substrate having a barrier property to moisture is used as the substrate 101, moisture can be prevented from being mixing into the light-emitting element layer 109 from the substrate 101 side. Note that the lighting device in this embodiment has a top emission structure as described above, whereby a substrate having a light-blocking property can be used as the substrate 101. In this embodiment, a stainless steel substrate is used as the substrate 101.

Examples of the materials of the first terminal 102 and the second terminal 103 include copper (Cu), titanium (Ti), tantalum (Ta), tungsten (W), molybdenum (Mo), chromium (Cr), neodymium (Nd), scandium (Sc), and nickel (Ni), and an alloy material containing any of these materials as its main component. A single film of any of the above materials or a stacked layer of any of the above materials may be used for the first terminal 102 and the second terminal 103.

The first electrode 104 is provided on the side opposite to a side where light is extracted and is formed using a reflective material. As the reflective material, a metal material such as aluminum, gold, platinum, silver, nickel, tungsten, chromium, molybdenum, iron, cobalt, copper, or palladium can be used. Other than the above, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

As a material of the partition wall 105 and the partition wall 106, for example, an organic resin such as polyimide, acrylic, polyamide, or epoxy or an inorganic insulating material can be used.

There is no particular limitation on the method for forming the partition wall 105 and the partition wall 106. A sputtering method, an evaporation method, a droplet discharging method (e.g., an inkjet method), a printing method (e.g., a screen printing method or an offset printing method), or the like may be used.

The EL layer 107 includes at least a layer containing a light-emitting organic compound. In addition, the EL layer 107 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of EL layers is provided between the first electrode 104 and the second electrode 108 can be used. A stacked-layer structure of two layers, three layers, or four layers (in particular, a stacked-layer structure of three layers) is preferably used. Detailed description of the structural example of the EL layer 107 will be made later on.

As a light-transmitting material for the second electrode 108, indium oxide, indium oxide-tin oxide (ITO), indium oxide-zinc oxide, zinc oxide, zinc oxide to which gallium is added, graphene, or the like can be used.

As the barrier layer 110 covering the light-emitting element layer 109, an aluminum oxide film, a silicon nitride film, a silicon oxynitride film, or the like, which can prevent moisture from being mixed into the outside is used. The barrier layer 110 is formed to have a thickness greater than or equal to 5 nm and less than or equal to 500 nm, preferably 100 nm. The barrier layer 110 is formed to have a refractive index substantially equal to the refractive index of the light-emitting element layer 109. These films each have a refractive index of greater than or equal to 1.65 and less than or equal to 2.3. The barrier layer 110 is formed to have a refractive index in this range and substantially equal to the refractive index of the light-emitting element layer 109. Therefore, a relatively large proportion of light emitted from the light-emitting element layer 109 passes through the barrier layer 110.

In the case of using a silicon nitride film as the barrier layer 110, a silicon nitride film formed by a surface wave plasma CVD method is preferably used. Surface wave plasma is high-density plasma with large area generated by utilizing a surface wave that is an electromagnetic wave propagated through a surface of a dielectric plate. Since the surface plasma is generated by electrodeless discharge, a substrate can be placed in a position sufficiently far from a high-energy portion of the plasma, so that a condition with less plasma damage can be obtained. The silicon nitride film formed by the surface wave plasma CVD method is preferable as the barrier layer 110 because of its high barrier property, i.e., low water transmission rate of approximately $10^{-7}$ g/m$^2$·day. In addition, the light transmittance of the silicon nitride film formed by the surface wave plasma CVD method is greater than 90% (thickness thereof is 2 μm), so that the light transmittance is high.

The resin layer 111 is formed using a high refractive index resin. For example, a thermosetting high refractive index resin material or a UV curable high refractive index resin material can be used.

The resin layer 111 is formed to have a refractive index substantially equal to those of the light-emitting element layer 109 and the barrier layer 110. For example, a resin having a refractive index greater than or equal to 1.65 and less than or equal to 2.3 is used to form the resin layer 111 having a refractive index in this range and substantially equal to those of the light-emitting element layer 109 and the barrier layer 110. Therefore, a relatively large proportion of light emitted from the light-emitting element layer 109 passes through the resin layer 111.

Further, when a drying agent is contained in the resin layer 111, moisture can be prevented from being mixed into the light-emitting element layer 109 even in the case where moisture is mixed from the resin substrate 115 side.

Figure 7:
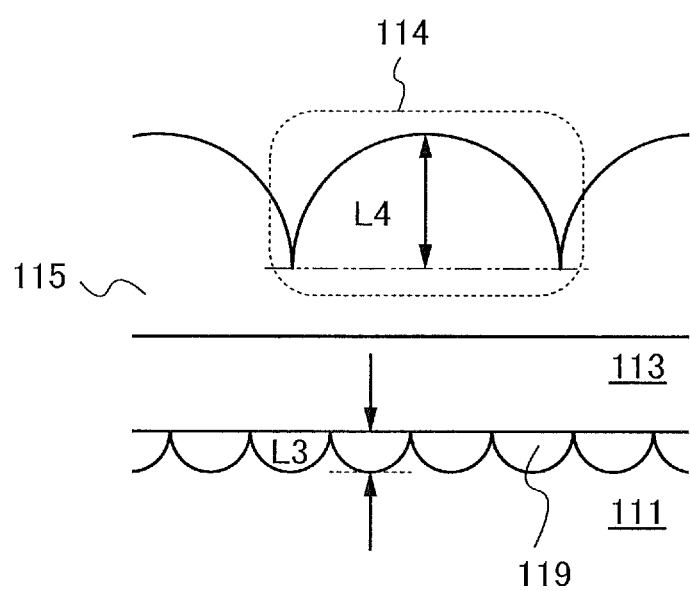
FIG. 7 is a cross-sectional view of a lighting device.

The granules 112 (projections 119) are each formed using a resin or glass having a refractive index substantially the same as that of the resin substrate 115. As such a resin, polyethylene terephthalate, polypropylene, nylon, or the like can be used, for example. A distance L3 from the interface between the resin layer 111 and the resin layer 113 (A dot-dashed line in FIG. 7. Note that FIG. 7 is an enlarged view of part of FIG. 5) to an apex of the projection 119 (a dotted line in FIG. 7) in the resin layer 111 is greater than or equal to 0.5 μm and less than or equal to 50 μm, preferably greater than or equal to 1 μm and less than or equal to 10 μm. The diameter of the granule 112 used to obtain the projection 119 may be selected so that the distance L3 has the above value. In this embodiment, a bead formed of polyethylene terephthalate whose diameter is 6 μm is used as the granule 112.

The resin layer 113 is formed using a resin having substantially the same refractive index as those of the resin substrate 115 and the projection 119. As the resin layer 113, an organic resin such as epoxy can be used.

Although the resin layer 120 is removed by the grinding and polishing, a resin similar to that of the resin layer 113 is preferably used as the resin layer 120 in consideration of a possibility of the remaining resin layer 120.

Note that the projection 119 and the resin layer 113 each have substantially the same refractive index as that of the resin substrate 115, so that there are a difference between the refractive indices of the resin layer 111 and the projection 119 and a difference between the refractive indices of the resin layer 111 and the resin layer 113. However, the reflection angle of light which is generated in the light-emitting element layer 109 and passes through the resin layer 111 is changed by the plurality of projections 119. Consequently, light can be extracted from the resin layer 111 to the resin layer 113 through the projections 119.

The resin substrate 115 having the plurality of microlenses 114 is formed with the use of a mold provided with an uneven structure. Resin pellets are arranged so that the resin pellets are embedded inside the uneven structure, and a resin sheet is provided over the arranged resin pellets. The resin pellets and the resin sheet are subjected to pressure treatment while being heated; thus, the resin substrate 115 having the plurality of microlenses 114 can be manufactured.

For the resin pellets and the resin sheet, a material which has a light-transmitting property and can be shaped as desired is used. In particular, a material transmitting visible light is preferably used. For example, an acrylic resin (a polymethyl methacrylate resin), a cyclic olefin copolymer resin, a cyclo olefin polymer resin, a polyester resin, a polyacrylonitrile resin, a polyimide resin, a polycarbonate resin, a polyethersulfone resin, a polyamide resin, a polystyrene resin, a polyamide imide resin, a polyvinylchloride resin, a polyethylene terephthalate resin, or a combination of these resins can be used. In addition, the visible light transmittance of the material is preferably greater than or equal to 85% in order to improve light extraction efficiency. An acrylic resin is preferable because of its high visible light transmittance. Further, a cyclic olefin copolymer resin and a cyclo olefin polymer resin are preferable because of their high visible light transmittance and heat resistance.

As described above, the uneven structure provided on the mold determines the shape and size of the microlens 114.

The plurality of microlenses 114 arranged in a matrix is preferable although the plurality of microlenses 114 arranged in a stripe is also effective. The cross-sectional shape of the microlens 114 is not particularly limited and for example, a hemisphere or a shape with an apex can be used. Examples of the cross-sectional shape with an apex include a circular cone, a pyramid (e.g., a triangular pyramid, a square pyramid, or a hexagonal pyramid), and the like.

The difference in the height of the unevenness of the microlens 114 (the distance L4 in FIG. 7) is the peak-to-valley (PV) value of the uneven structure and is preferably greater than or equal to 100 μm and less than or equal to 5 mm, more preferably greater than or equal to 300 μm and less than or equal to 1 mm. Note that in this specification, a PV value refers to the maximum height from the bottom to an apex of the unevenness (i.e., the maximum difference in the height of the unevenness).

Note that the distance from the interface between the resin layer 111 and the resin layer 113 (a dot-dashed line in FIG. 7) to a bottom surface of the microlens 114 (a two-dot-dashed line in FIG. 7) is preferably greater than or equal to 0 μm and less than or equal to 1 mm, more preferably greater than or equal to 50 μm and less than or equal to 250 μm. As the distance between the projection 119 and the microlens 114 shortens, the spread of light in a horizontal direction through the resin layer 113 or the resin substrate 115 can be prevented.

According to this embodiment, the microlens array 116 with which light can be extracted from the light-emitting element layer 109 more efficiently can be manufactured in a simple process.

Further, according to this embodiment, the manufacturing cost of the microlens array 116 can be reduced.

Furthermore, according to this embodiment, the minute uneven structure can be formed using the granule 112 and the large uneven structure (the microlens 114) can be formed by using the mold; therefore, the manufacturing cost can be reduced and the productivity can be increased.

Note that materials and structures similar to those in Embodiment 1 can be used for the EL layer 107 and the light-emitting element layer 109 including the first electrode 104, the EL layer 107, and the second electrode 108. In the case of stacking a plurality of EL layers 107 between the first electrode 104 and the second electrode 108, Embodiment 1 can be referred to.

[Embodiment 3]

In this embodiment, structures of microlens arrays, methods for manufacturing the microlens array, and lighting devices, which are different from those in Embodiment 1 and Embodiment 2, will be described.

Figure 2B:
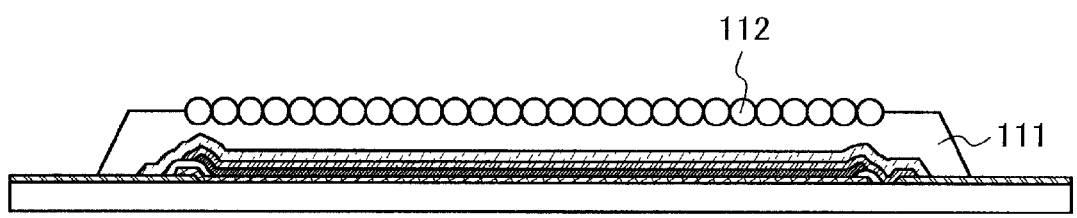
Figure 2C:
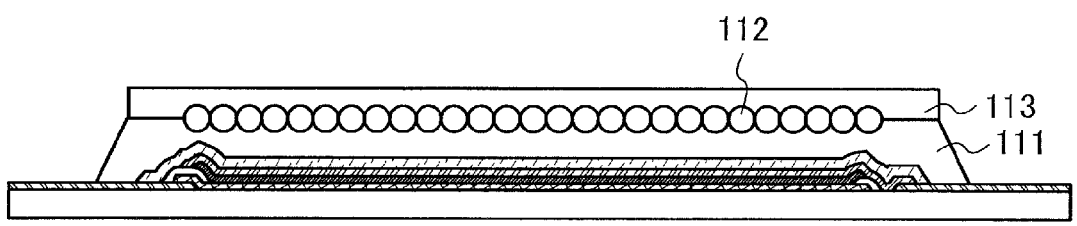
Figure 8A:
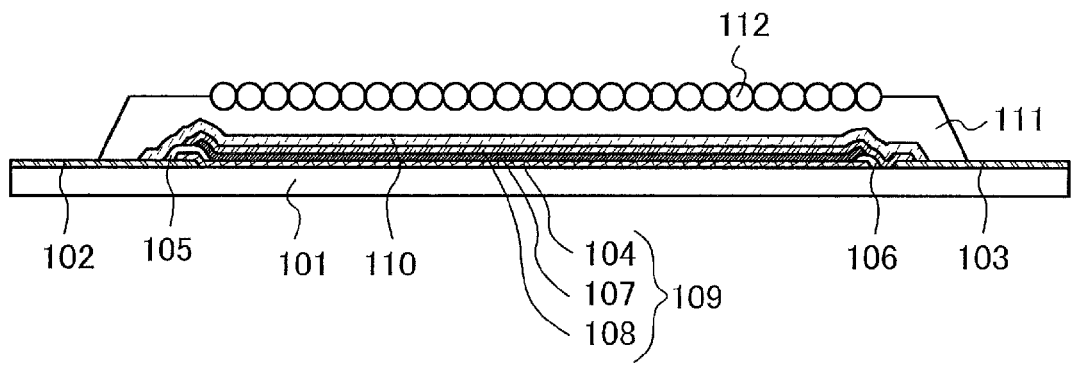
FIGS. 8A to 8C are cross-sectional views showing a manufacturing process of a lighting device.

First, steps up to the manufacturing step shown in FIG. 2B, i.e., the steps of scattering the granules 112 over the resin layer 111 in an uncured state and curing the resin layer 111 are performed according to the description in Embodiment 1 (see FIG. 8A).

Figure 8B:
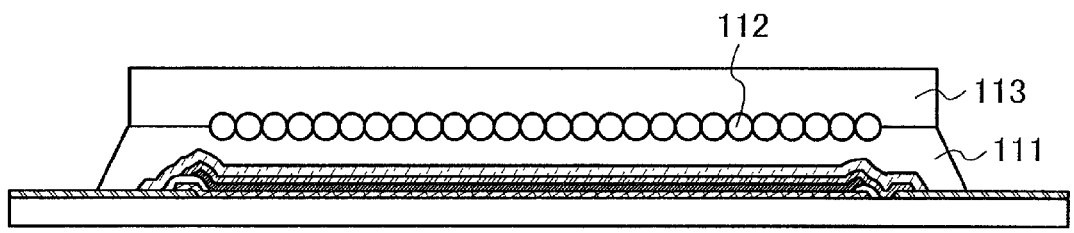

Next, a resin that is the material of the resin layer 113 in an uncured state is applied over the resin layer 111 in which the granule 112 is embedded (see FIG. 8B).

A plurality of granules 117 each having the diameter greater than that of the granule 112 is arranged over the uncured resin layer 113. Next, the resin layer 113 is cured (see FIG. 8C).

Through the above, the plurality of granules 112 is provided at the interface between the resin layer 111 and the resin layer 113. In addition, the plurality of granules 117 is provided at the interface between the resin layer 113 and the air.

The diameter of the granule 112 is selected so that the distance from the interface between the resin layer 111 and the resin layer 113 to an apex of the granule 112 is greater than or equal to 0.5 μm and less than or equal to 50 μm, preferably greater than or equal to 1 μm and less than or equal to 10 μm. The diameter of the granule 117 is selected so that the distance from the interface between the resin layer 113 and the air to an apex of the granule 117 is greater than or equal to 100 μm and less than or equal to 5 mm, preferably greater than or equal to 300 μm and less than or equal to 1 mm.

Further, a material similar to that of the granule 112 can be used for the granule 117.

According to this embodiment, it is possible to provide a microlens array 118 including the plurality of granules 112, the resin layer 113, and the plurality of granules 117.

Note that in this embodiment, two kinds of granules having different diameters are used for the granule 112 and the granule 117; however, the present invention is not limited to this. A granule having a diameter different from those of the granule 112 and the granule 117, preferably a grain having a diameter greater than that of the granule 112 and less than that of the granule 117 may be included in the resin layer 113 between the granule 112 and the granule 117. For example, a microlens array may be manufactured in such a manner that first granules each having a first diameter are scattered over the resin layer 111, the resin layer 113 is applied, second granules each having a second diameter greater than the first diameter are scattered, the resin layer 113 is additionally applied, and granules each having a third diameter greater than the second diameter are scattered. Further, the number of kinds of granules having different diameters is not limited to three and may be four or more.

When granules having different diameters are stacked in such a manner, reflection of light is repeated at the interfaces between the granules and the resin layers 113. When light is reflected at the interfaces between the granules and the resin layers 113 repeatedly, a probability of extraction of light from the light-emitting element layer 109 to the outside might be increased.

According to this embodiment, it is possible to provide a highly efficient lighting device from which light can be extracted from the light-emitting layer 109 efficiently.

Further, according to this embodiment, the manufacturing cost of a lighting device including the microlens array 118 can be reduced.

Figure 8C:
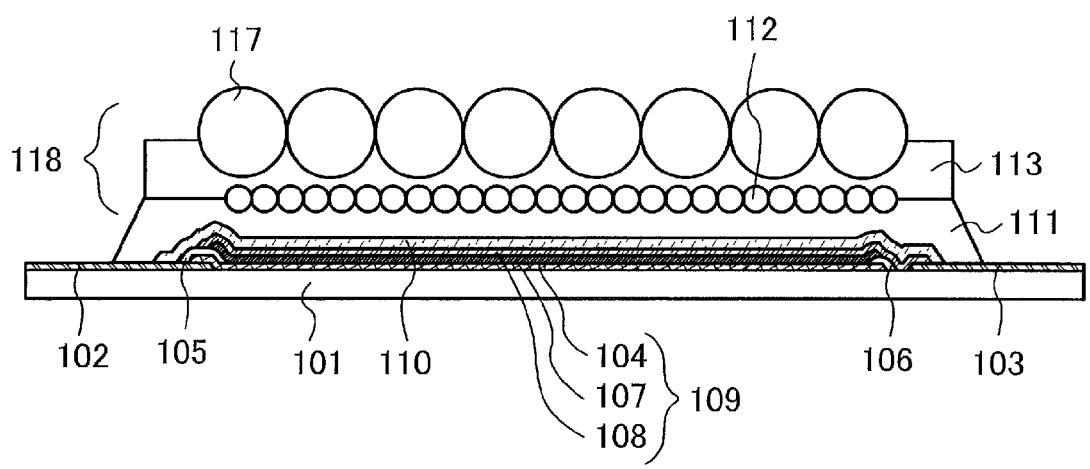
Figure 9A:
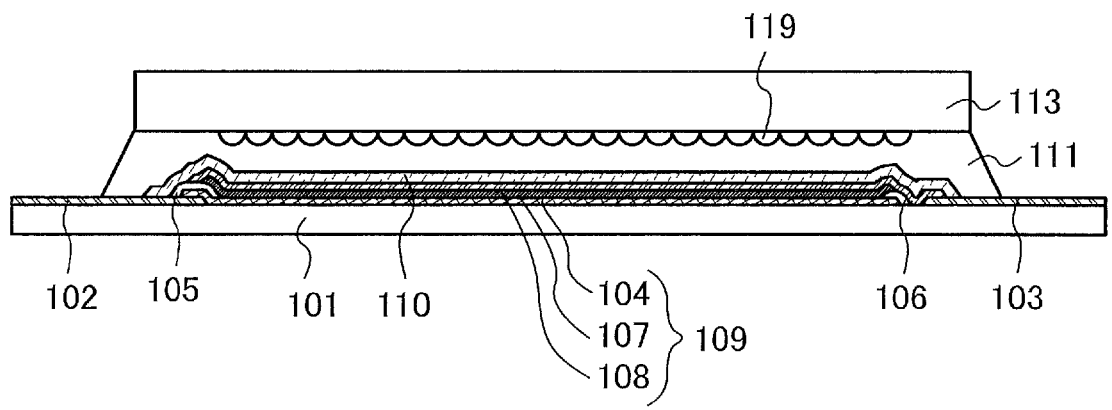
FIGS. 9A and 9B are cross-sectional views of lighting devices.
Figure 9B:
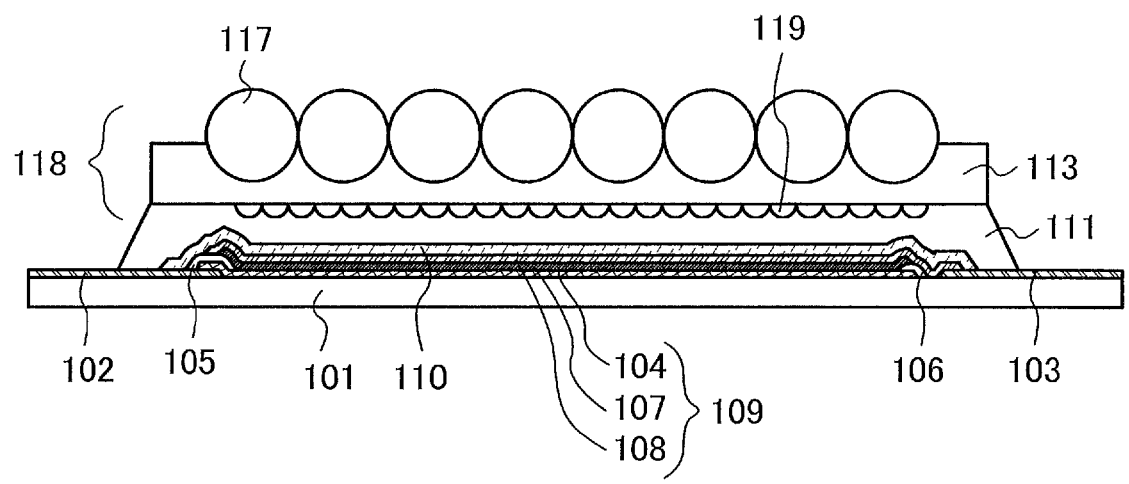

In addition, a structure different from that shown in FIGS. 8A to 8C is shown in FIGS. 9A and 9B.

First, steps up to the manufacturing step shown in FIG. 6D, i.e., the step of applying the resin that is the material of the resin layer 113 in an uncured state over the resin layer 111 in which the projection 119 is arranged, are performed according to the description in Embodiment 2 (see FIG. 9A).

The plurality of granules 117 each of which is used to obtain the projection 119 and has the diameter greater than that of the granule 112 is arranged over the uncured resin layer 113. Then, the resin layer 113 is cured (see FIG. 9B).

Through the above, the plurality of projections 119 is provided inside the resin layer 111. In addition, an uneven structure including the plurality of granules 117 is provided at the interface between the resin layer 113 and the air.

The diameter of the granule 112 used to obtain the projection 119 may be selected so that the distance from the flat surface to an apex of the projection 119 is greater than or equal to 0.5 μm and less than or equal to 50 μm, preferably greater than or equal to 1 μm and less than or equal to 10 μm. The diameter of the granule 117 may be selected so that the distance from the interface between the resin layer 113 and the air to an apex of the granule 117 is greater than or equal to 100 μm and less than or equal to 5 mm, preferably greater than or equal to 300 μm and less than or equal to 1

Further, a material similar to that of the granule 112 can be used for a material of the granule 117.

According to this embodiment, it is possible to provide the microlens array 118 including the plurality of projections 119, the resin layer 113, and the plurality of granules 117.

Note that in this embodiment, two kinds of granules having different diameters are used for the granule 112 used to obtain the projection 119, and the granule 117; however, the present invention is not limited to this. A granule having the diameter different from those of the granule 112 and the granule 117, preferably a grain having the diameter greater than that of the granule 112 and less than that of the granule 117 may be included in the resin layer 113 between the projection 119 and the granule 117. For example, a microlens array may be manufactured in such a manner that first granules each having a first diameter are scattered over the resin layer 111, grinding and polishing are performed so that the projections 119 are formed, second granules each having a second diameter greater than the first diameter are scattered, the resin layer 113 is additionally applied, and granules each having a third diameter greater than the second diameter are scattered. Further, the number of kinds of granules having different diameters is not limited to three and may be four or more.

When granules having different diameters are stacked in such a manner, reflection of light is repeated at the interfaces between the granules and the resin layers 113. When light is reflected at the interfaces between the granules and the resin layers 113 repeatedly, a probability of extraction of light from the light-emitting element layer 109 to the outside might be increased.

According to this embodiment, it is possible to provide a highly efficient lighting device from which light can be extracted from the light-emitting layer 109 efficiently.

According to this embodiment, the manufacturing cost of the lighting device can be reduced.

27

[Embodiment 4]

In this embodiment, structures of microlens arrays, methods for manufacturing the microlens array, and lighting devices, which are different from those of Embodiments 1 to 3, will be described.

Figure 10A:
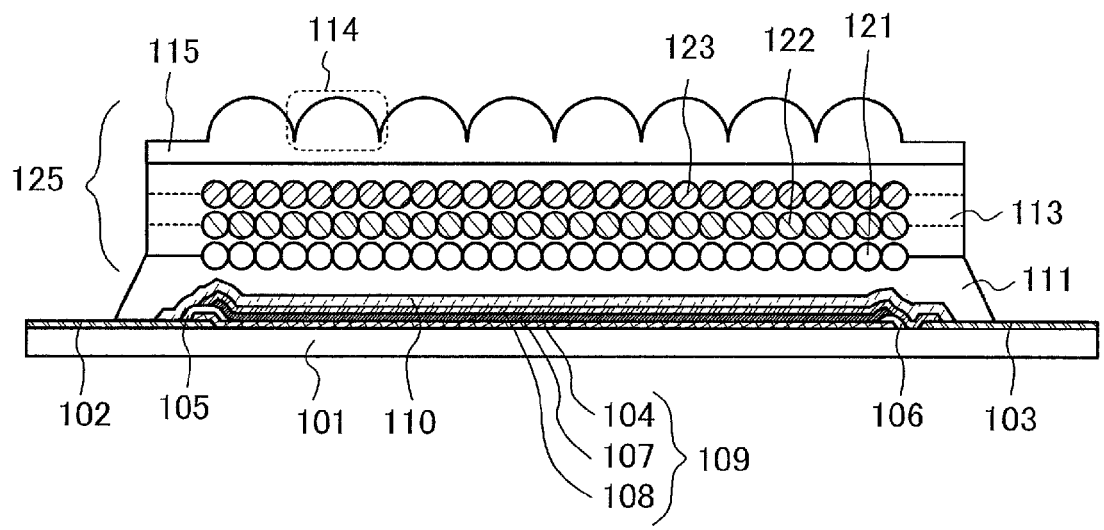
FIGS. 10A and 10B are cross-sectional views of lighting devices.

A microlens array 125 shown in FIG. 10A includes a first granule 121 provided at the interface between the resin layer 111 and the resin layer 113, a second granule 122 provided over the first granule 121, and a third granule 123 provided over the second granule 122. The second granule 122 and the third granule 123 are embedded inside the resin layer 113. Note that the first granule 121 is similar to the granule 112.

The first granule 121, the second granule 122, and the third granule 123 may have the same size or different sizes. Note that as the first granule 121, the second granule 122, and the third granule 123 are arranged on a side closer to the air (are arranged in an upper layer), refractive indices thereof become close to the refractive index of the air (i.e., 1.0). In contrast, as the first granule 121, the second granule 122, and the third granule 123 are arranged far from the air (are arranged in a lower layer and become close to the light-emitting element layer 109), refractive indices thereof become higher.

First, as steps for forming the first granule 121, the second granule 122, and the third granule 123, steps up to the manufacturing step shown in FIG. 2B, i.e., the steps of scattering the first granules 121 over the resin layer 111 in an uncured state and curing the resin layer 111 are performed according to the description in Embodiment 1.

Next, a resin that is the material of the resin layer 113 in an uncured state is applied over the resin layer 111 in which the first granule 121 is embedded.

A plurality of second granules 122 each having a refractive index higher than that of the first granule 121 is arranged over the uncured resin layer 113.

Next, a resin layer 113 in an uncured state is additionally applied over the resin layer 113 in which the second granule 122 is embedded.

A plurality of third granules 123 each having a refractive index higher than that of the second granule 122 is arranged over the uncured resin layer 113.

Next, a resin layer 113 in an uncured state is additionally applied over the resin layer 113 in which the third granule 123 is embedded.

Then, the uncured resin layer 113 is cured by heat treatment or the like.

The cured resin layer 113 is bonded to the resin substrate 115 having the plurality of the microlenses 114. Thus, the microlens array 125 is formed (see FIG. 10A).

Alternatively, the microlens array 125 may be formed in such a manner that the resin layer 113 in an uncured state is additionally applied over the resin layer 113 in which the third granule 123 is embedded and then the resin substrate 115 having the plurality of microlenses 114 is arranged over the uncured resin layer 113, and the resin layer 113 is cured by heat treatment or the like. At this time, the additional resin layer 113 functions as an adhesive bonding the resin substrate 115 to the resin layer 113.

The granule 122 and the granule 123 having different refractive indices are provided inside the resin layer 113. As the granule 122 and the granule 123 are arranged on a side closer to the air, the refractive indices thereof become close to that of the air. The reflection angle of light entering inside the resin layer 113 is changed by the granule 122 and the granule 123 which are having different refractive indices. Thus, light can be easily extracted to the outside.

Further, as in Embodiment 3, a fourth granule 126 having the diameter greater than that of the first granule 121 may be used, instead of the resin substrate 115 having the plurality of microlenses 114. The fourth granules 126 may be scattered over the uncured resin layer 113 in a manner similar to that of the granules 117 in Embodiment 3. After the fourth granules 126 are scattered, the uncured resin layer 113 is cured. Thus, a microlens array 127 is formed (see FIG. 10B).

According to this embodiment, it is possible to provide a highly efficient lighting device using the microlens array 125 with which light can be extracted from the light-emitting layer 109 efficiently and a highly efficient lighting device using the microlens array 127 with which light can be extracted from the light-emitting layer 109 efficiently.

Further, according to this embodiment, the manufacturing costs of the lighting device including the microlens array 125 and the lighting device including the microlens array 127 can be reduced.

Figure 10B:
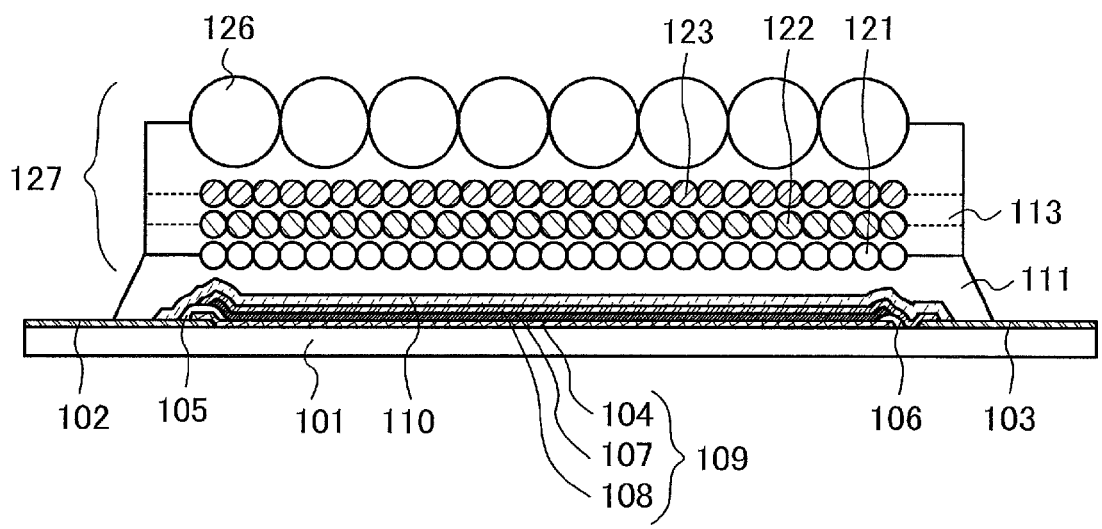
Figure 11A:
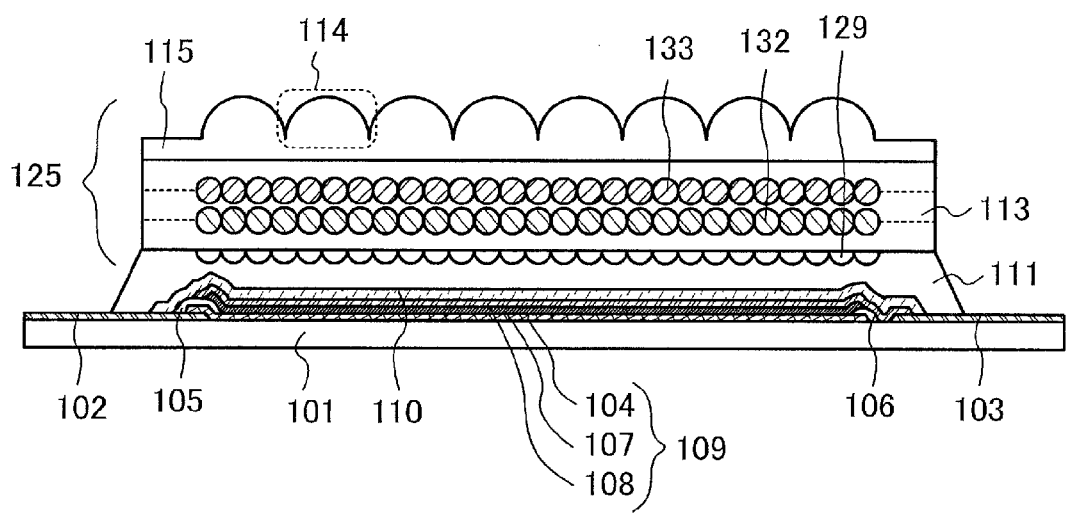
FIGS. 11A and 11B are cross-sectional views of lighting devices.
Figure 11B:
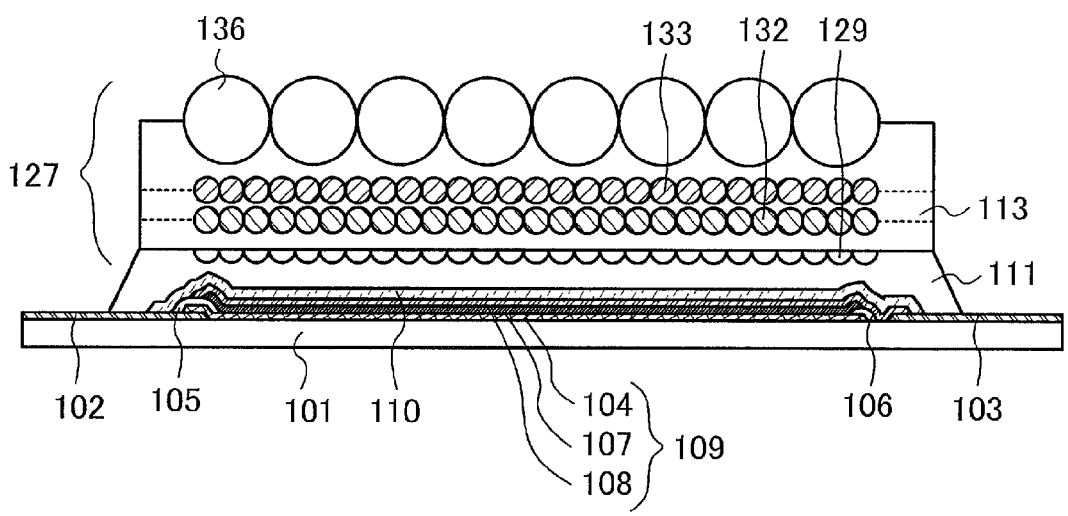

Structures different from those shown in FIGS. 10A and 10B are shown in FIGS. 11A and 11B. The microlens array 125 shown in FIG. 11A is in contact with the interface between the resin layer 111 and the resin layer 113, and a projection 129 is arranged inside the resin layer 111. The microlens array 125 includes a first granule 132 provided over the projection 129 and a second granule 133 provided over the first granule 132. The first granule 132 and the second granule 133 are embedded inside the resin layer 113. Note that the projection 129 is similar to the projection 119. The first granule 132 is similar to the granule 122. The second granule 133 is similar to the granule 123.

The first granule 132 and the second granule 133 may have the same size or different sizes. Note that as the projection 129, the first granule 132, and the second granule 133 are arranged on a side closer to the air (are arranged in an upper layer), refractive indices thereof become close to the refractive index of the air (i.e., 1.0). In contrast, as the projection 129, the first granule 132, and the second granule 133 are arranged far from the air (are arranged in a lower layer and become close to the light-emitting element layer 109), refractive indices thereof become higher.

First, as steps for forming the first granule 132 and the second granule 133, steps up to the manufacturing step shown in FIG. 6E, i.e., the step of applying the resin that is a material of the resin layer 113 in an uncured state over the resin layer 111 in which the projection 119 is arranged, are performed according to the description in Embodiment 2. Hereinafter the projection 119 is referred to as the projection 129; however, the projection 129 is similar to the projection 119.

A plurality of first granules 132 each having a refractive index higher than that of the projection 129 is arranged over the uncured resin layer 113.

Next, a resin layer 113 in an uncured state is additionally applied over the resin layer 113 in which the first granule 132 is embedded.

A plurality of second granules 133 each having a refractive index higher than that of the first granule 132 is arranged over the uncured resin layer 113.

Next, a resin layer 113 in an uncured state is additionally applied over the resin layer 113 in which the second granule 133 is embedded.

Then, the uncured resin layer 113 is cured by heat treatment or the like.

The cured resin layer 113 is bonded to the resin substrate 115 having the plurality of the microlenses 114. Thus, the microlens array 125 is formed (see FIG. 11A).

Alternatively, the microlens array 125 may be formed in such a manner that a resin layer 113 in an uncured state is additionally applied over the resin layer 113 in which the second granule 133 is embedded and then the resin substrate 115 having the plurality of microlenses 114 is arranged over the uncured resin layer 113, and the resin layer 113 is cured by heat treatment or the like. At this time, the additional resin layer 113 functions as an adhesive bonding the resin substrate 115 to the resin layer 113.

The granule 132 and the granule 133 having different refractive indices are provided inside the resin layer 113. As the granule 132 and the granule 133 are arranged on a side closer to the air, the refractive indices of the granule 132 and the granule 133 become close to that of the air. The reflection angle of light entering inside the resin layer 113 is changed by the granule 132 and the granule 133 which are having different refractive indices. Thus, light can be easily extracted to the outside.

Further, as in Embodiment 3, a third granule 136 having the diameter greater than that of the projection 129 may be used, instead of the resin substrate 115 having the plurality of microlenses 114. The granule 136 is similar to the granule 126. The third granules 136 may be scattered over the uncured resin layer 113 in a manner similar to that in Embodiment 3. After the third granules 136 are scattered, the uncured resin layer 113 is cured. Thus, the microlens array 127 is formed (see FIG. 11B).

According to this embodiment, it is possible to provide a highly efficient lighting device from which light can be extracted from the light-emitting layer 109 efficiently.

According to this embodiment, the manufacturing cost of the lighting device can be reduced

[Embodiment 5]

In this embodiment, application examples of the lighting device described in any of Embodiments 1 to 4 will be described with reference to FIGS. 12A and 12B.

Figure 12A:
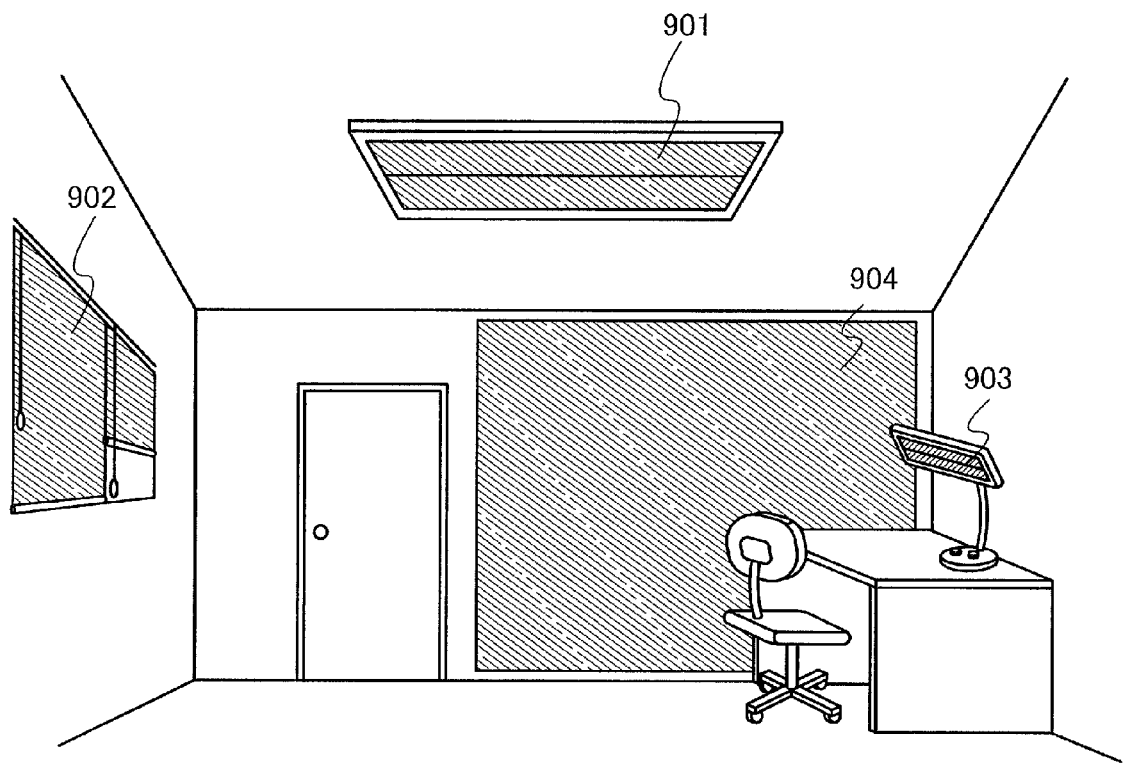
FIGS. 12A and 12B show application examples of a lighting device.

FIG. 12A shows an indoor lighting device 901, an indoor lighting device 904, and a desk lamp 903 each using a lighting device of one embodiment of the disclosed invention. Since the lighting device of one embodiment of the disclosed invention can have a large area, the lighting device can be used as a lighting device having a large area. Further, the lighting device can be used as a roll-type lighting device 902.

Figure 12B:
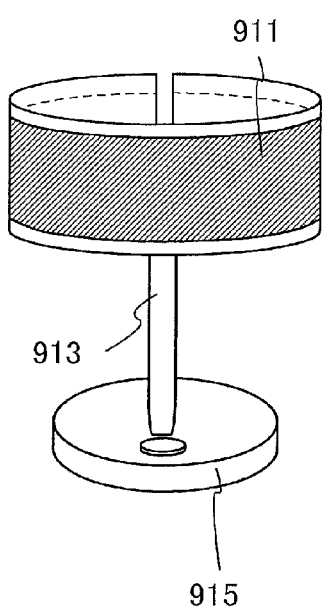

FIG. 12B shows another example of the lighting device. A desk lamp shown in FIG. 12B includes a lighting portion 911, a support 913, a support base 915, and the like. The lighting portion 911 includes the lighting device described in any of Embodiments 1 to 4. In one embodiment of the present invention, a lighting device having a curved surface or a lighting device having a flexible lighting portion can be provided. The use of a flexible lighting device not only improves the degree of freedom in design of the lighting device but also enables the lighting device to be mounted onto a portion having a curved surface, such as the ceiling or a dashboard of a car.

Note that description is made on the lighting devices in Embodiments 1 to 4; however the lighting device that is one embodiment of the disclosed invention can be used as a light-emitting device. The light-emitting device of one embodiment of the disclosed invention can be used for a traffic light, a neon light, an emergency exit light, and the like, for example.

This embodiment can be freely combined with other embodiments.

This application is based on Japanese Patent Application serial No. 2011-039850 filed with Japan Patent Office on Feb. 25, 2011 and Japanese Patent Application serial No. 2011-039849 filed with Japan Patent Office on Feb. 25, 2011, the entire contents of which are hereby incorporated by reference.

What is claimed is:

1. A lighting device comprising:
   a light-emitting element layer;
   a first resin layer over the light-emitting element layer;
   a second resin layer over the first resin layer; and
   a plurality of projections each comprising:
      an apex inside the first resin layer; and
      a flat surface in a same plane as an interface between the first resin layer and the second resin layer; and
   a resin substrate over the second resin layer, the resin substrate comprising an uneven structure at an interface with air,
   wherein a difference in a height of unevenness of the uneven structure is greater than or equal to 100 μm and less than or equal to 5 mm.

2. A lighting device according to claim 1,
   wherein a distance from the apex of each one of the plurality of projections to the interface between the first resin layer and the second resin layer is greater than or equal to 0.5 μm and less than or equal to 50 μm.

3. A lighting device according to claim 1,
   wherein a thickness of each one of the plurality of projections in a direction parallel to a thickness direction of the first resin layer is greater than or equal to 0.5 μm and less than or equal to 50 μm.

4. A lighting device according to claim 1,
   wherein a shape of the flat surface of each one of the plurality of projections is at least one of a circle and an ellipse.

5. A lighting device according to claim 1,
   wherein the plurality of projections comprises at least one selected from the group consisting of a resin and glass.

6. A lighting device according to claim 1, further comprising:
   wherein the difference in the height of unevenness of the uneven structure is greater than a distance from the apex of each one of the plurality of projections to the interface between the first resin layer and the second resin layer.

7. A lighting device according to claim 1, wherein each of the plurality of projections has a hemispherical shape.

8. A lighting device comprising:
   a light-emitting element layer;
   a first resin layer over the light-emitting element layer;
   a second resin layer over the first resin layer; and
   a plurality of projections each comprising:
      an apex inside the first resin layer; and
      a flat surface in a same plane as an interface between the first resin layer and the second resin layer;
   a barrier layer over the light-emitting element layer; and
   a resin substrate over the second resin layer, the resin substrate comprising an uneven structure at an interface with air,
   wherein:
   the barrier layer has a first refractive index;
   the first resin layer has the first refractive index;
   the second resin layer has a second refractive index that is lower than the first refractive index and higher than a refractive index of the air;
   the plurality of projections has the second refractive index; and
   the resin substrate has the second refractive index.

9. A lighting device according to claim 8,
   wherein a distance from the apex of each one of the plurality of projections to the interface between the first resin layer and the second resin layer is greater than or equal to 0.5 μm and less than or equal to 50 μm.

10. A lighting device according to claim 8,
wherein a thickness of each one of the plurality of projections in a direction parallel to a thickness direction of the first resin layer is greater than or equal to 0.5 μm and less than or equal to 50 μm.

11. A lighting device according to claim 8,
wherein a shape of the flat surface of each one of the plurality of projections is at least one of a circle and an ellipse.

12. A lighting device according to claim 8,
wherein the plurality of projections comprises at least one selected from the group consisting of a resin and glass.

13. A lighting device according to claim 8, further comprising:
wherein a difference in a height of unevenness of the uneven structure is greater than a distance from the apex of each one of the plurality of projections to the interface between the first resin layer and the second resin layer.

14. A lighting device according to claim 8, wherein each of the plurality of projections has a hemispherical shape.

\* \* \* \* \*